(12) United States Patent
Cheng et al.

(10) Patent No.: US 12,002,422 B2
(45) Date of Patent: Jun. 4, 2024

(54) DISPLAY SUBSTRATE AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Hongfei Cheng, Beijing (CN); Xueguang Hao, Beijing (CN); Hui Li, Beijing (CN); Chen Xu, Beijing (CN); Pan Li, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 96 days.

(21) Appl. No.: 17/293,086

(22) PCT Filed: Sep. 14, 2020

(86) PCT No.: PCT/CN2020/115075
§ 371 (c)(1),
(2) Date: May 12, 2021

(87) PCT Pub. No.: WO2021/196530
PCT Pub. Date: Oct. 7, 2021

(65) Prior Publication Data
US 2022/0310010 A1      Sep. 29, 2022

(30) Foreign Application Priority Data

Mar. 30, 2020    (CN) .......................... 202010234010.7

(51) Int. Cl.
*G09G 3/3233*       (2016.01)
*G09G 3/3266*       (2016.01)
(Continued)

(52) U.S. Cl.
CPC ......... *G09G 3/3233* (2013.01); *G09G 3/3266* (2013.01); *H10K 59/1213* (2023.02);
(Continued)

(58) Field of Classification Search
CPC .. G09G 3/3233; G09G 3/3241; G09G 3/3266; G09G 2300/0408;
(Continued)

(56) References Cited

U.S. PATENT DOCUMENTS 8,878,186 B2    11/2014  Ono
10,388,714 B2    8/2019  Chen et al.
(Continued)

FOREIGN PATENT DOCUMENTS

CN    103582952 A    2/2014
CN    107195660 A    9/2017
(Continued)

OTHER PUBLICATIONS

Extended European search report issued by the European Patent Office for the corresponding application No. 20897628.2. The EESR has a mailing date of Jul. 31, 2023.

*Primary Examiner* — Stacy Khoo
(74) *Attorney, Agent, or Firm* — Michael J. Musella, Esq.; Dilworth & Barrese, LLP.

(57) ABSTRACT

A display substrate and a display device. The display substrate includes a base substrate and a plurality of sub-pixels, a first power line and an electrical connection layer on the base substrate. Each sub-pixel includes a pixel circuit, and a plurality of sub-pixels are arranged in a plurality of rows and a plurality of columns along a first direction and a second direction. The sub-pixel is electrically connected with the light-emitting element through the electrical connection layer, and the portion, which is in the display region of the display substrate, of the electrical connection layer is not
(Continued)

overlapped with the first power line in a direction perpendicular to the base substrate.

18 Claims, 11 Drawing Sheets

(51) Int. Cl.
*H10K 59/121* (2023.01)
*H10K 59/123* (2023.01)
*H10K 59/131* (2023.01)
*H01L 27/12* (2006.01)

(52) U.S. Cl.
CPC ......... *H10K 59/123* (2023.02); *H10K 59/131* (2023.02); *G09G 2300/0426* (2013.01); *G09G 2300/0819* (2013.01); *G09G 2300/0842* (2013.01); *G09G 2300/0861* (2013.01); *G09G 2310/0202* (2013.01); *G09G 2310/0286* (2013.01); *H01L 27/124* (2013.01)

(58) Field of Classification Search
CPC ... G09G 2300/0426; G09G 2300/0819; G09G 2300/0842; G09G 2300/0861; G09G 2310/0202; G09G 2310/0251; G09G 2310/0286; G09G 2320/0209; H01L 27/3248; H01L 27/3262; H01L 27/3276; H01L 27/124; G11C 19/28
See application file for complete search history.

(56) References Cited

U.S. PATENT DOCUMENTS

| | | |
|---|---|---|
| 10,854,701 B2 | 12/2020 | Park et al. |
| 10,957,756 B2 | 3/2021 | Lee et al. |
| 2014/0071029 A1 | 3/2014 | Roh et al. |
| 2014/0097455 A1 | 4/2014 | Ono |
| 2017/0358641 A1 | 12/2017 | Park et al. |
| 2018/0047799 A1 | 2/2018 | Lim et al. |
| 2018/0151663 A1 | 5/2018 | Kim et al. |
| 2019/0073955 A1* | 3/2019 | Zou ..................... G09G 3/3258 |
| 2019/0385522 A1 | 12/2019 | Song et al. |
| 2023/0200162 A1* | 6/2023 | An ........................ H10K 71/00 257/40 |

FOREIGN PATENT DOCUMENTS

| | | | |
|---|---|---|---|
| CN | 107482036 A | 12/2017 | |
| CN | 108878494 A | 11/2018 | |
| CN | 109301088 A | 2/2019 | |
| CN | 109697658 A | 4/2019 | |
| CN | 109697958 A | 4/2019 | |
| CN | 110610684 A | 10/2019 | |
| CN | 110610684 A | 12/2019 | |
| CN | 110890398 A | 3/2020 | |
| CN | 111128080 A | 5/2020 | |
| KR | 20200021021 A | 2/2020 | |
| TW | 201626552 A * | 7/2016 | ....... G02F 1/136286 |
| WO | WO-2020040378 A1 * | 2/2020 | ......... H01L 27/3244 |

* cited by examiner

DISPLAY SUBSTRATE AND DISPLAY DEVICE

The present application claims the priority of Chinese patent application No. 202010234010.7, filed on Mar. 30, 2020, and the entire disclosure of which is incorporated herein by reference as part of the disclosure of this application.

TECHNICAL FIELD

Embodiments of the present disclosure relate to a display substrate and a display device.

BACKGROUND

In the display field of organic light-emitting diodes (OLEDs), with rapid development of high-resolution products, higher requirements are put forward on the structural design of display substrates, such as the arrangement of pixels and signal lines.

SUMMARY

At least one embodiment the present disclosure provides a display substrate, comprising a base substrate and a plurality of sub-pixels in the display region of the base substrate. The base substrate comprises a display region and a non-display region; each of the plurality of sub-pixels comprises a pixel circuit, the pixel circuit is configured to drive a light-emitting element to emit light, and pixels circuits of the plurality of sub-pixels are arranged in a plurality of rows and a plurality of columns along a first direction and a second direction; the pixel circuit comprises a driving sub-circuit, a data writing sub-circuit, a compensation sub-circuit, and a storage sub-circuit; the driving sub-circuit comprises a control terminal, a first terminal, and a second terminal, and is configured to be connected to the light-emitting element and control a driving current flowing through the light-emitting element; the data writing sub-circuit comprises a control terminal, a first terminal, and a second terminal, the control terminal of the data writing sub-circuit is configured to receive a first scanning signal, the first terminal of the data writing sub-circuit is configured to receive a data signal, the second terminal of the data writing sub-circuit is electrically connected to the driving sub-circuit, and the data writing sub-circuit is configured to write the data signal into the first terminal of the driving sub-circuit in response to the first scanning signal; the compensation sub-circuit comprises a control terminal, a first terminal, and a second terminal, the control terminal of the compensation sub-circuit is configured to receive a second scanning signal, the first terminal and the second terminal of the compensation sub-circuit are electrically connected to the control terminal and the second terminal of the driving sub-circuit, respectively, and the compensation sub-circuit is configured to perform threshold compensation on the driving sub-circuit in response to the second scanning signal; and the storage sub-circuit is electrically connected to the control terminal of the driving sub-circuit and a first voltage terminal and is configured to store the data signal, the storage sub-circuit comprises a storage capacitor, the storage capacitor comprises a first electrode and a second electrode, the first electrode of the storage capacitor is electrically connected to the first voltage terminal, and the second electrode of the storage capacitor is electrically connected to the control terminal of the driving sub-circuit.

The substrate further comprises a first power line and an electrical connection layer. The first power line is in the display region and is extended along the first direction, and the first power line is connected to the first voltage terminal and is configured to provide a first power voltage for the plurality of sub-pixels. The electrical connection layer is on a side of the pixel circuit away from the base substrate and comprises a first portion in the display region, the first portion comprises a plurality of first connection electrodes, and the plurality of first connection electrodes are arranged in one-to-one correspondence with the plurality of sub-pixels, respectively. The pixel circuit of each sub-pixel is electrically connected to a corresponding first connection electrode through a first via hole, and the first connection electrode corresponding to the each sub-pixel is configured to be electrically connected to the light-emitting element through a second via hole, so as to electrically connect the pixel circuit of the each sub-pixel to the light-emitting element; the first via hole and the second via hole are not overlapped in a direction perpendicular to the base substrate; and the first portion of the electrical connection layer and the first power line are not overlapped in the direction perpendicular to the base substrate.

In some examples, the first via hole and the second via hole are arranged along the first direction.

In some examples, the display substrate further comprises a power signal line and a gate driving circuit in the non-display region. The gate driving circuit is configured to provide the first scanning signal and the second scanning signal for the sub-pixels, and the power signal line is configured to provide a power signal for the gate driving circuits of the sub-pixels; the electrical connection layer further comprises a second portion in the non-display region, the second portion comprises an auxiliary signal line, and the auxiliary signal line is connected in parallel with the power signal line.

In some examples, the gate driving circuit comprises a plurality of shift register units, the plurality of shift register units are connected to the plurality of rows of sub-pixels in one-to-one correspondence, and each of the plurality of shift register units is configured to output the first scanning signal and the second scanning signal to a corresponding row of sub-pixels through an output node; each of the plurality of shift register units comprises a first capacitor connected to the output node, and the first capacitor comprises a first electrode and a second electrode; and the second portion of the electrical connection layer further comprises an auxiliary capacitor electrode, and the auxiliary capacitor electrode is connected in parallel with the first electrode or the second electrode of the first capacitor.

In some examples, the sub-pixel further comprises a first light-emitting control sub-circuit, the first light-emitting control sub-circuit comprises a control terminal, a first terminal, and a second terminal, the first terminal of the first light-emitting control sub-circuit is electrically connected to the driving sub-circuit, the second terminal of the first light-emitting control sub-circuit is configured to be electrically connected to the first connection electrode through a third via hole, and the control terminal of the first light-emitting control sub-circuit is configured to receive a first light-emitting control signal; the first light-emitting control sub-circuit is configured to allow the driving current to be applied to the light-emitting element in response to the first light-emitting control signal; and the first via hole, the second via hole, and the third via hole are not overlapped with each other in the direction perpendicular to the base substrate.

In some examples, the display substrate further comprises a first light-emitting control line, the first light-emitting control line is extended along the second direction and is connected to the control terminal of the first light-emitting control sub-circuit to provide the first light-emitting control signal, and an orthographic projection of the first via hole on the base substrate and an orthographic projection of the second via hole on the base substrate are on both sides of an orthographic projection of the first light-emitting control line on the base substrate, respectively.

In some examples, for at least one of the plurality of the sub-pixels, a portion, exposed by the second via hole, of the first connection electrode has an inclined surface with respect to the base substrate.

In some examples, each sub-pixel further comprises a second connection electrode, the second connection electrode is on a side of the first electrode of the storage capacitor away from the base substrate, and the second connection electrode is respectively connected to the second electrode of the storage capacitor and the second terminal of the compensation sub-circuit.

In some examples, the second connection electrode is overlapped with the first connection electrode in the direction perpendicular to the base substrate.

In some examples, the driving sub-circuit comprises a first transistor, and a gate electrode, a first electrode, and a second electrode of the first transistor serve as the control terminal, the first terminal, and the second terminal of the driving sub-circuit, respectively.

In some examples, the first electrode of the storage capacitor comprises a fourth via hole, and the second connection electrode is electrically connected to the second electrode of the storage capacitor through the fourth via hole.

In some examples, the fourth via hole and an active layer of the first transistor are not overlapped with each other in the direction perpendicular to the base substrate.

In some examples, the active layer of the first transistor comprises a bending structure.

In some examples, the active layer of the first transistor is similar to a f/shape, and comprises a first portion, a second portion, and a connection portion, the first portion and the second portion of the active layer are both linear and not on one identical horizontal line, and the connection portion of the active layer connects the first portion and the second portion of the active layer and is arc-shaped.

In some examples, an average width of the connection portion of the active layer is greater than an average width of the first portion or the second portion of the active layer.

In some examples, the display substrate further comprises a data line, and the data line is extended along the first direction and is connected to the first terminal of the data writing sub-circuit to provide the data signal, the first electrode of the storage capacitor overlaps with the first electrode of the first transistor in the direction perpendicular to the base substrate, the first electrode of the first transistor has a first electrode side which is close to the data line and along the first direction, the first electrode of the storage capacitor has a capacitor electrode side which is close to the data line and along the first direction, and in the second direction, the capacitor electrode side is closer to the data line than the first electrode side.

In some examples, the non-display region comprises a bonding region, the electrical connection layer further comprises a second portion in the non-display region, and the second portion of the electrical connection layer comprises a bonding electrode in the non-display region; and the display substrate further comprises an auxiliary bonding electrode, the auxiliary bonding electrode is in a same layer and of a same material as the first power line, and the auxiliary bonding electrode contacts with the bonding electrode for connection.

In some examples, the second portion of the electrical connection layer further comprises a wire in the non-display region, one end of the wire is connected to the bonding electrode, and another end of the wire is extended to the display region; and the non-display region further comprises a bending region, and a part of the wire is in the bending region.

In some examples, the display substrate further comprises an organic insulating layer, the organic insulating layer is between the electrical connection layer and the pixel circuit, and the first via hole is in the organic insulating layer; and the organic insulating layer comprises a bending portion in the bending region, and the bending portion is on a side of the wire close to the base substrate and is in direct contact with the base substrate.

In some examples, no pattern of the electrical connection layer in the display region is overlapped with the first power line in the direction perpendicular to the base substrate.

Embodiments of the present disclosure further provide a display device comprising and one of the above display substrates.

BRIEF DESCRIPTION OF THE DRAWINGS

In order to clearly illustrate the technical solutions of the embodiments of the present disclosure, the drawings of the embodiments will be briefly described in the following. It is obvious that the described drawings are only related to some embodiments of the present disclosure and thus are not limitative to the present disclosure.

DETAILED DESCRIPTION

Figure 1A:
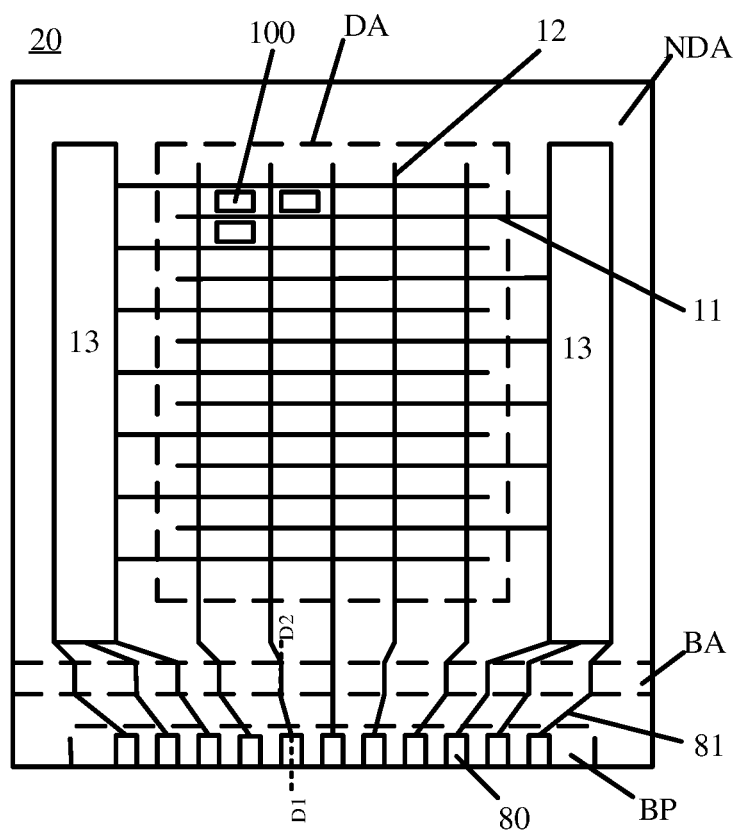
FIG. 1A is a first schematic diagram of a display substrate provided by at least one embodiment of the present disclosure.

The technical solutions of the embodiments will be described below in a clearly and fully understandable way in connection with the related drawings. Exemplary embodiments of the present disclosure and features and advantageous details thereof will be described more comprehensively. It should be noted the features shown drawings are not necessarily drawn in a real scale. The present disclosure omits descriptions of the knows materials, components, and process technologies, which does not make the exemplary embodiments of the present disclosure obscure. The examples are provided to make the implementation of the exemplary embodiments of the present disclosure better understood, so that those skilled in the art can implement the embodiments. Thus, these embodiments should not be limitative to the scope of the disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

In the field of OLED (organic light-emitting diode) display, with the rapid development of high-resolution products, higher requirements are put forward on the structural design of display substrates, such as the arrangement of pixels and signal lines. For example, compared to an OLED display device with a resolution of 4K, an OLED display device with a large size and a resolution of 8K needs to be provided with the doubled number of sub-pixel units, and therefore the pixel density has increased correspondingly. In one aspect, the line width of the signal line is reduced accordingly, which causes the resistance of the signal line to increase; and in another aspect, there is more overlap between signal lines, which causes the parasitic capacitance of the signal line to increase, so that the resistance and capacitance load of the signal line increases. Correspondingly, the signal delay caused by the resistance and capacitance load (i.e. RC delay), voltage drop (IR drop), voltage rise (IR rise) and other phenomena may also become serious. These phenomena seriously affect the display quality of the display product. For example, when the layout design is more compact, the flatness of the pixel electrode is affected, thereby affecting the uniformity of light emission and reducing the display effect.

FIG. 1A is a schematic diagram of a display substrate provided by at least one embodiment of the present disclosure. As illustrated in FIG. 1A, the display substrate 20 includes a display region DA and a non-display region NDA surrounding the display region DA. The display region DA is provided with a plurality of sub-pixels 100 arranged in an array, a plurality of gate lines 11, and a plurality of data lines 12. Each sub-pixel 100 includes a light-emitting element and a pixel circuit that drives the light-emitting element. The plurality of gate lines 11 and the plurality of data lines 12 cross with each other to define a plurality of pixel regions arranged in an array in the display region, and a pixel circuit of a sub-pixel 100 is provided in each pixel region. The pixel circuit is, for example, a conventional pixel circuit, such as a 2T1C (that is, including two transistors and a capacitor) pixel circuit, or an nTmC (n, m are positive integers and n is greater than or equal to 2) pixel circuit, such as a pixel circuit with 4T2C, 5T1C, 7T1C, or the like. In different embodiments, the pixel circuit may further include a compensation sub-circuit, the compensation sub-circuit includes an internal compensation sub-circuit or an external compensation sub-circuit, and the compensation sub-circuit may include a transistor, a capacitor, or the like. For example, according to needs, the pixel circuit may further include a reset circuit, a light-emitting control sub-circuit, a detection circuit, or the like. For example, the display substrate may further include a gate driving circuit 13 and a data driving circuit (not shown) located in the non-display region NDA. The gate driving circuit 13 is connected to the pixel circuit through the gate line 11 to provide various scanning signals (such as the first scanning signal and the second scanning signal described below), and the data driving circuit is connected to the pixel circuit through the data line 12 to provide the data signal. As illustrated in FIG. 1A, the display substrate 20 includes two gate driving circuits 13, and the two gate driving circuits 13 are respectively located on both sides of the display region DA and are respectively connected to the gate lines corresponding to the odd and even rows. The arrangement may improve the response speed of the gate driving circuit. The positional relationship among the gate driving circuit 13, the gate line 11, and the data line 12 in the display substrate shown in FIG. 1A is only an example, and the actual arrangement position may be designed according to needs.

For example, as illustrated in FIG. 1A, the non-display region NDA of the display substrate 20 further includes a bonding region BP. The bonding region BP is provided with a bonding pad or bonding electrode 80, and the bonding electrode is used to bond with external components (for example, the driver chip), so as to provide various signals for the pixel array structure in the display region, such as a power supply voltage signal, a timing signal, and so on. For example, in the case where the preparation of the display substrate 20 is completed, the bonding electrode 80 is in a bare state. FIG. 1A only schematically shows the bonding electrode 80 connected to the gate driving circuit 13 and the data line 12, but the embodiments of the present disclosure are not limited thereto. The pixel array structure in the display region DA is connected to the bonding electrode 80 through the wire 81, so as to achieve signal transmission between the pixel array structure and the bonding electrode.

For example, the display substrate 20 is a flexible substrate, and the non-display region NDA of the display substrate 20 may further include a bending region BA. As illustrated in FIG. 1A, the bending region BA is located between the display region DA and the bonding region BP. By bending the bending region BA, the bonding region BP can be bent to the back of the display substrate 20 to achieve the narrow frame display. For example, the bending region BA is located between the display region DA and the bonding region BP.

For example, the display substrate 20 may further include a control circuit (not shown). For example, the control circuit is configured to control the data driving circuit to apply the data signal and control the gate driving circuit to apply the scanning signal. An example of the control circuit is a timing control circuit (a T-con circuit). The control circuit may be in various forms. For example, the control circuit may include a processor and a memory, the memory includes executable codes, and the processor runs the executable codes to execute the above detection method.

For example, the processor may be a central processing unit (CPU) or another form of processing device with data processing capability and/or instruction executing capability, and may include, for example, a micro-processor, a programmable logic controller (PLC), and the like.

For example, the storage device may include one or more computer program products, and the computer program products may include various forms of computer-readable storage media, such as a volatile memory and/or a non-volatile memory. The volatile memory may include a random access memory (RAM) and/or a cache memory. The non-volatile memory may include a read-only memory (ROM), a hard disk, a flash memory, or the like. One or more computer program instructions can be stored in a computer-readable storage medium, and the processor can perform functions expected by the program instructions. Various application programs and various data can also be stored in the computer-readable storage medium.

The pixel circuit may include a driving sub-circuit, a data writing sub-circuit, a compensation sub-circuit, and a storage sub-circuit, and may also include a light-emitting control sub-circuit, a reset circuit, or the like as needed.

Figure 1B:
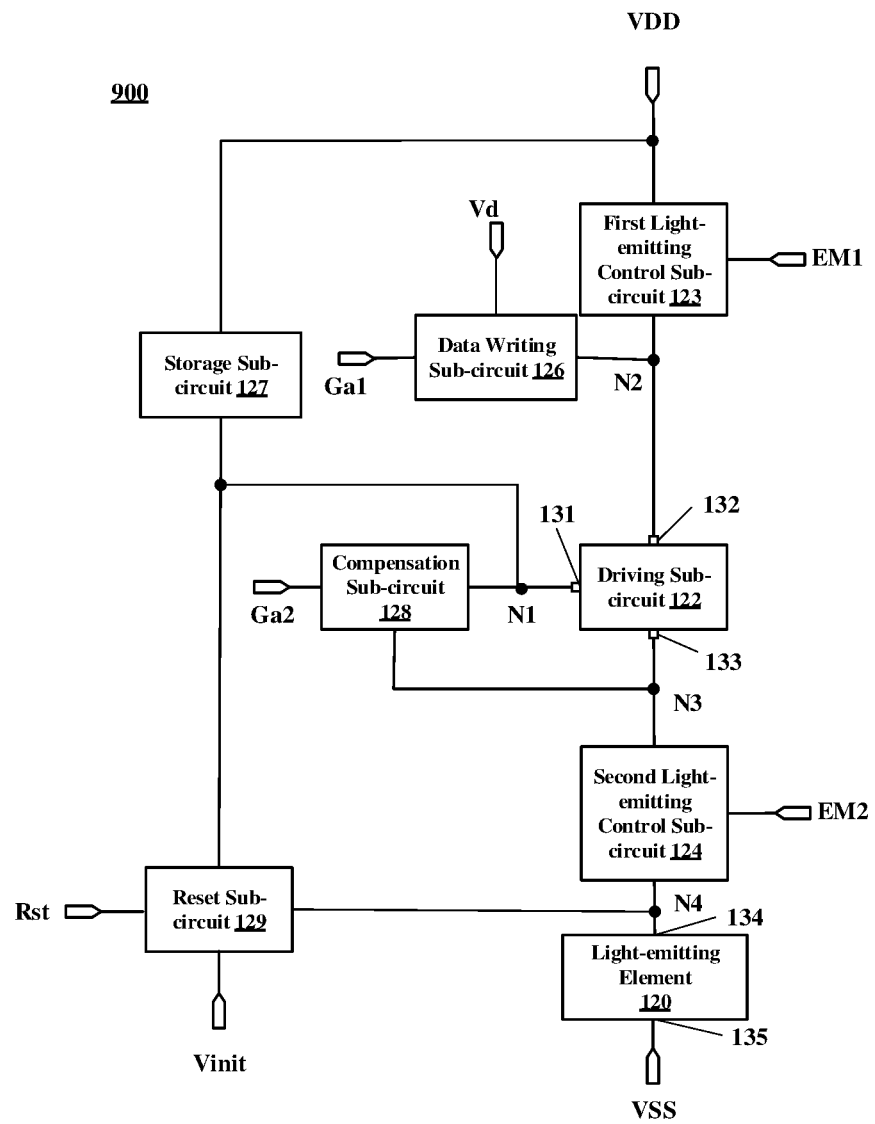
FIG. 1B is a first schematic diagram of a pixel circuit in a display substrate provided by at least one embodiment of the present disclosure.

FIG. 1B shows a schematic diagram of a pixel circuit. As illustrated in FIG. 1B, the pixel circuit 900 includes a driving sub-circuit 122, a data writing sub-circuit 126, a compensation sub-circuit 128, a storage sub-circuit 127, a first light-emitting control sub-circuit 123, a second light-emitting control sub-circuit 124, and a reset circuit 129.

For example, the driving sub-circuit 122 includes a control terminal 131, a first terminal 132, and a second terminal 133, and is configured to control the driving current flowing through the light-emitting element 120. The control terminal 131 of the driving sub-circuit 122 is connected to the first node N1, the first terminal 132 of the driving sub-circuit 122 is connected to the second node N2, and the second terminal 133 of the driving sub-circuit 122 is connected to the third node N3.

For example, the data writing sub-circuit 126 includes a control terminal, a first terminal, and a second terminal. The control terminal of the data writing sub-circuit 126 is configured to receive a first scanning signal, the first terminal of the data writing sub-circuit 126 is configured to receive a data signal, and the second terminal of the data writing sub-circuit 126 is connected to the first terminal 132 (the second node N2) of the driving sub-circuit 122 and is configured to write the data signal into the first terminal 132 of the driving sub-circuit 122 in response to the first scanning signal Ga1. For example, the first terminal of the data writing sub-circuit 126 is connected to the data line 12 to receive the data signal, and the control terminal of the data writing sub-circuit 126 is connected to the gate line 11 to receive the first scanning signal Ga1.

For example, in the data writing phase, the data writing sub-circuit 126 can be turned on in response to the first scanning signal Ga1, so that the data signal can be written to the first terminal 132 (the second node N2) of the driving sub-circuit 122, and the data signal can be stored in the storage sub-circuit 127, so that the driving current for driving the light-emitting element 120 to emit light can be generated according to the data signal in the light-emitting phase.

For example, the compensation sub-circuit 128 includes a control terminal, a first terminal, and a second terminal. The control terminal of the compensation sub-circuit 128 is configured to receive the second scanning signal Ga2. The first terminal and the second terminal of the compensation sub-circuit 128 are respectively electrically connected to the control terminal 131 and the second terminal 133 of the driving sub-circuit 122. The compensation sub-circuit is configured to perform threshold compensation on the driving sub-circuit 120 in response to the second scanning signal.

For example, the storage sub-circuit 127 is electrically connected to the control terminal 131 of the driving sub-circuit 122 and the first voltage terminal VDD, and is configured to store the data signal written by the data writing sub-circuit 126. For example, in the data writing and compensation phase, the compensation sub-circuit 128 can be turned on in response to the second scanning signal Ga2, so that the data signal written by the data writing sub-circuit 126 can be stored in the storage sub-circuit 127. For example, in the data writing and compensation phase, the compensation sub-circuit 128 can electrically connect the control terminal 131 and the second terminal 133 of the driving sub-circuit 122, so that the information related to the threshold voltage of the driving sub-circuit 122 can be accordingly stored in the storage sub-circuit. Thus, the stored data signal and the threshold voltage can be used to control the driving sub-circuit 122 during the light-emitting phase, so that the output of the driving sub-circuit 122 is compensated.

For example, the first light-emitting control sub-circuit 123 is connected to the first terminal 132 (the second node N2) of the driving sub-circuit 122 and the first voltage terminal VDD, and is configured to apply the first power voltage of the first voltage terminal VDD to the first terminal 132 of the driving sub-circuit 122 in response to the first light-emitting control signal. For example, as illustrated in FIG. 1B, the first light-emitting control sub-circuit 123 is connected to the first light-emitting control terminal EM1, the first voltage terminal VDD, and the second node N2.

For example, the second light-emitting control sub-circuit 124 is connected to the second light-emitting control terminal EM2, the first terminal 134 of the light-emitting element 120, and the second terminal 133 of the driving sub-circuit 122, and is configured to allow the driving current to be applied to the light-emitting element 122 in response to the second light-emitting control signal.

For example, in the light-emitting phase, the second light-emitting control sub-circuit 124 is turned on in response to the second light-emitting control signal provided by the second light-emitting control terminal EM2, so that the driving sub-circuit 122 can be electrically connected to the light-emitting element 120 through the second light-emitting control sub-circuit 124, so as to drive the light-emitting element 120 to emit light under the control of the driving current. In the non-light-emitting phase, the second light-emitting control sub-circuit 124 is turned off in response to the second light-emitting control signal, so as to avoid the current from flowing through the light-emitting element 120 to cause the light-emitting element 120 to emit light, which can improve the corresponding contrast of the display device.

For another example, in the initialization phase, the second light-emitting control sub-circuit 124 can also be turned on in response to the second light-emitting control signal, so as to perform a reset operation on the driving sub-circuit 122 and the light-emitting element 120 together with a reset circuit.

For example, the second light-emitting control signal EM2 can be the same as or different from the first light-emitting control signal EM1. For example, the first light-emitting control signal EM1 and the second light-emitting control signal EM2 can be connected to the same or different signal output terminals.

For example, the reset circuit 129 is connected to the reset voltage terminal Vinit and the first terminal 134 (the fourth node N4) of the light-emitting element 120, and is configured to apply the reset voltage to the first terminal 134 of the light-emitting element 120 in response to the reset signal. In other examples, as illustrated in FIG. 1B, the reset signal may also be applied to the control terminal 131 of the driving sub-circuit, that is, applied to the first node N1. For example, the reset signal is the second scanning signal, and the reset signal may also be another signal synchronized with the second scanning signal, which is not limited in the embodiments of the present disclosure. For example, as illustrated in FIG. 1B, the reset circuit 129 is respectively connected to the first terminal 134 of the light-emitting element 120, the reset voltage terminal Vinit, and the reset control terminal Rst (the reset control line). For example, in the initialization phase, the reset circuit 129 can be turned on in response to the reset signal, so that the reset voltage can be applied to the first terminal 134 of the light-emitting element 120 and the first node N1, so as to perform the reset operation on the driving sub-circuit 122, the compensation sub-circuit 128, and the light-emitting element 120 to eliminate the influence of the previous light-emitting phase.

For example, the light-emitting element 120 includes the first terminal 134 and the second terminal 135. The first terminal 134 of the light-emitting element 120 is configured to be coupled to the second terminal 133 of the driving sub-circuit 122, and the second terminal 135 of the light-emitting element 120 is configured to be connected to the second voltage terminal VSS. For example, in an example, as illustrated in FIG. 1B, the first terminal 134 of the light-emitting element 120 may be connected to the third node N3 through the second light-emitting control sub-circuit 124. The embodiments of the present disclosure include but are not limited to this situation. For example, the light-emitting element 120 can be various types of OLEDs, such as top-emission, bottom-emission, double-side emission, or the like, and can emit red light, green light, blue light, white light, or the like. The first electrode and the second electrode of the OLED serve as the first terminal 134 and the second terminal 135 of the light-emitting element, respectively. The embodiments of the present disclosure do not limit the specific structure of the light-emitting element.

It should be noted that in the description of at least one embodiment of the present disclosure, the first node N1, the second node N2, the third node N3, and the fourth node N4 do not necessarily represent actual components, but represent connection points of related circuits in the circuit diagram.

It should be noted that in the description of the embodiments of the present disclosure, the symbol Vd may represent both the data signal terminal and the level of the data signal. Similarly, the symbols Ga1 and Ga2 may respectively represent the first scanning signal and the second scanning signal, and may also respectively represent the first scanning signal terminal and the second scanning signal terminal. The symbol Rst may represent both the reset control terminal and the reset signal. The symbol Vinit may represent both the reset voltage terminal and the reset voltage. The symbol VDD may represent both the first voltage terminal and the first power voltage. The symbol VSS may represent both the second voltage terminal and the second power voltage. The following embodiments are the same as those above, and details are not described again.

Figure 1C:
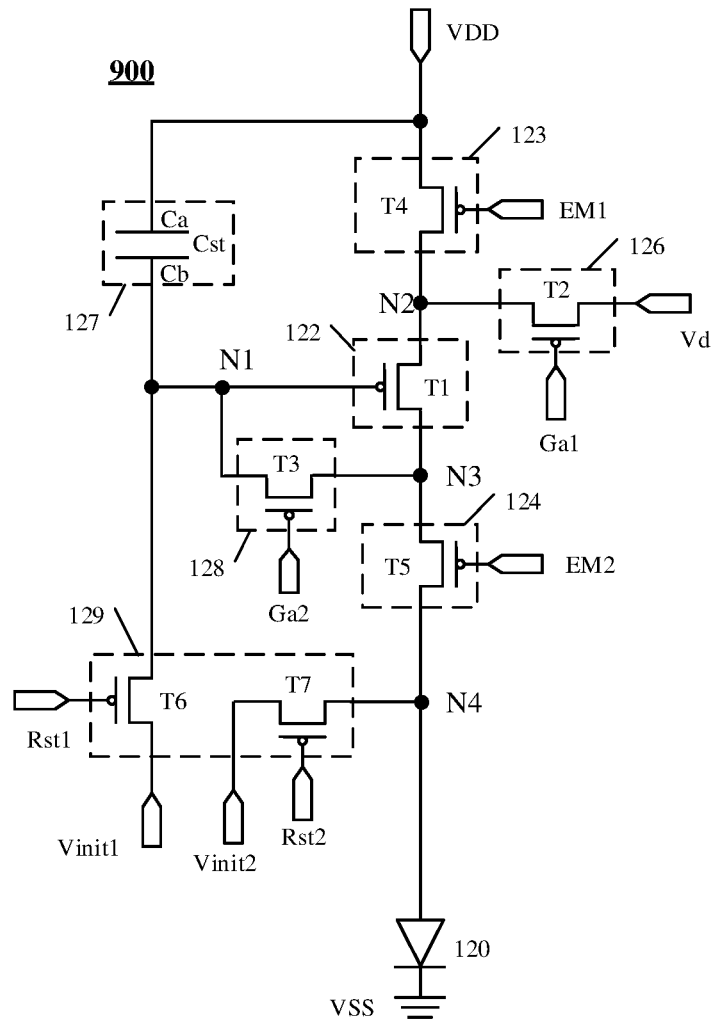
FIG. 1C is a second schematic diagram of a pixel circuit in a display substrate provided by at least one embodiment of the present disclosure.

FIG. 1C is a circuit diagram of a specific implementation example of the pixel circuit illustrated in FIG. 1B. As illustrated in FIG. 1C, the pixel circuit 900 includes first to seventh transistors T1, T2, T3, T4, T5, T6, T7, and a storage capacitor Cst. For example, the first transistor T1 is used as a driving transistor, and the other second to seventh transistors are used as switching transistors.

For example, as illustrated in FIG. 1C, the driving sub-circuit 122 may be implemented as the first transistor T1. The gate electrode of the first transistor T1 serves as the control terminal 131 of the driving sub-circuit 122 and is connected to the first node N1. The first electrode of the first transistor T1 serves as the first terminal 132 of the driving sub-circuit 122 and is connected to the second node N2. The second electrode of the first transistor T1 serves as the second terminal 133 of the driving sub-circuit 122 and is connected to the third node N3.

For example, as illustrated in FIG. 1C, the data writing sub-circuit 126 may be implemented as the second transistor T2. The gate electrode of the second transistor T2 is connected to the first scanning line (the first scanning signal terminal Ga1) to receive the first scanning signal, the first electrode of the second transistor T2 is connected to the data line (the data signal terminal Vd) to receive the data signal, and the second electrode of the second transistor T2 is connected to the first terminal 132 (the second node N2) of the driving sub-circuit 122. For example, the second transistor T2 is a P-type transistor, such as a thin film transistor with the active layer of low-temperature doped polysilicon.

For example, as illustrated in FIG. 1C, the compensation sub-circuit 128 may be implemented as the third transistor T3. The gate electrode of the third transistor T3 is configured to be connected to the second scanning line (the second scanning signal terminal Ga2) to receive the second scanning signal, the first electrode of the third transistor T3 is connected to the control terminal 131 (the first node N1) of the driving sub-circuit 122, and the second electrode of the third transistor T3 is connected to the second terminal 133 (the third node N3) of the driving sub-circuit 122.

For example, as illustrated in FIG. 1C, the storage sub-circuit 127 may be implemented as the storage capacitor Cst. The storage capacitor Cst includes a first electrode Ca and a second electrode Cb. The first electrode Ca of the storage capacitor is coupled, such as electrically connected, to the first voltage terminal VDD, and the second electrode Cb of the storage capacitor is coupled, such as electrically connected, to the control terminal 131 of the driving sub-circuit 122.

For example, as illustrated in FIG. 1C, the first light-emitting control sub-circuit 123 may be implemented as the fourth transistor T4. The gate electrode of the fourth transistor T4 is connected to the first light-emitting control line (the first light-emitting control terminal EM1) to receive the first light-emitting control signal. The first electrode of the fourth transistor T4 is connected to the first voltage terminal VDD to receive the first power voltage. The second electrode of the fourth transistor T4 is connected to the first terminal 132 (the second node N2) of the driving sub-circuit 122.

For example, the first terminal and the second terminal of the light-emitting element 120 may also be referred to as the first electrode and the second electrode of the light-emitting element, respectively. For example, the light-emitting element 120 may be implemented as a light-emitting diode, such as an OLED. The first electrode 134 (for example, an anode) of the light-emitting element 120 is connected to the fourth node N4 and is configured to receive the driving current from the second terminal 133 of the driving sub-circuit 122 through the second light-emitting control sub-circuit 124, and the second electrode 135 (for example, a cathode) of the light-emitting element 120 is configured to be connected to the second voltage terminal VSS to receive the second power voltage. For example, the second voltage terminal may be grounded, that is, VSS can be 0V.

For example, the second light-emitting control sub-circuit 124 may be implemented as the fifth transistor T5. The gate electrode of the fifth transistor T5 is connected to the second light-emitting control line (the second light-emitting control terminal EM2) to receive the second light-emitting control signal. The first electrode of the fifth transistor T5 is connected to the second terminal 133 (the third node N3) of the driving sub-circuit 122. The second electrode of the fifth transistor T5 is connected to the first terminal 134 (the fourth node N4) of the light-emitting element 120.

For example, the reset circuit 129 may include a first reset circuit and a second reset circuit. The first reset circuit is configured to apply the first reset voltage Vini1 to the first node N1 in response to the first reset signal Rst1. The second reset circuit is configured to apply the second reset voltage Vini2 to the fourth node N4 in response to the second reset signal Rst2. For example, as illustrated in FIG. 1C, the first reset circuit is implemented as the sixth transistor T6, and the second reset circuit is implemented as the seventh transistor T7. The gate electrode of the sixth transistor T6 is configured to be connected to the first reset control terminal Rst1 to receive the first reset signal Rst1, the first electrode of the sixth transistor T6 is connected to the first reset voltage terminal Vinit1 to receive the first reset voltage Vinit1, and the second electrode of the sixth transistor T6 is configured to be connected to the first node N1. The gate electrode of the seventh transistor T7 is configured to be connected to the second reset control terminal Rst2 to receive the second reset signal Rst2, the first electrode of the seventh transistor T7 is connected to the second reset voltage terminal Vinit2 to receive the second reset voltage Vinit2, and the second electrode of the seventh transistor T7 is configured to be connected to the fourth node N4.

It should be noted that the transistors used in the embodiments of the present disclosure may all be thin film transistors or field effect transistors, or may be other switching devices with the same characteristics. In the embodiments of the present disclosure, thin film transistors are used as examples for description. The source electrode and drain electrode of the transistor used here can be symmetrical in structure, so that the source electrode and drain electrode of the transistor can be structurally indistinguishable. In the embodiments of the present disclosure, in order to distinguish the two electrodes of the transistor other than the gate electrode, one electrode is directly described as the first electrode and the other electrode is described as the second electrode. In addition, transistors may be divided into N-type and P-type transistors according to the characteristics. In the case where the transistor is a P-type transistor, the turn-on voltage is a low-level voltage (for example, 0V, −5V, −10V or other suitable voltages), and the turn-off voltage is a high-level voltage (for example, 5V, 10V or other suitable voltages). In the case where the transistor is an N-type transistor, the turn-on voltage is a high-level voltage (for example, 5V, 10V or other suitable voltages), and the turn-off voltage is a low-level voltage (for example, 0V, −5V, −10V or other suitable voltages). It should be noted that the embodiments of the present disclosure are all described by using P-type transistors as examples, but the present disclosure is not limited in this aspect.

Figure 2A:
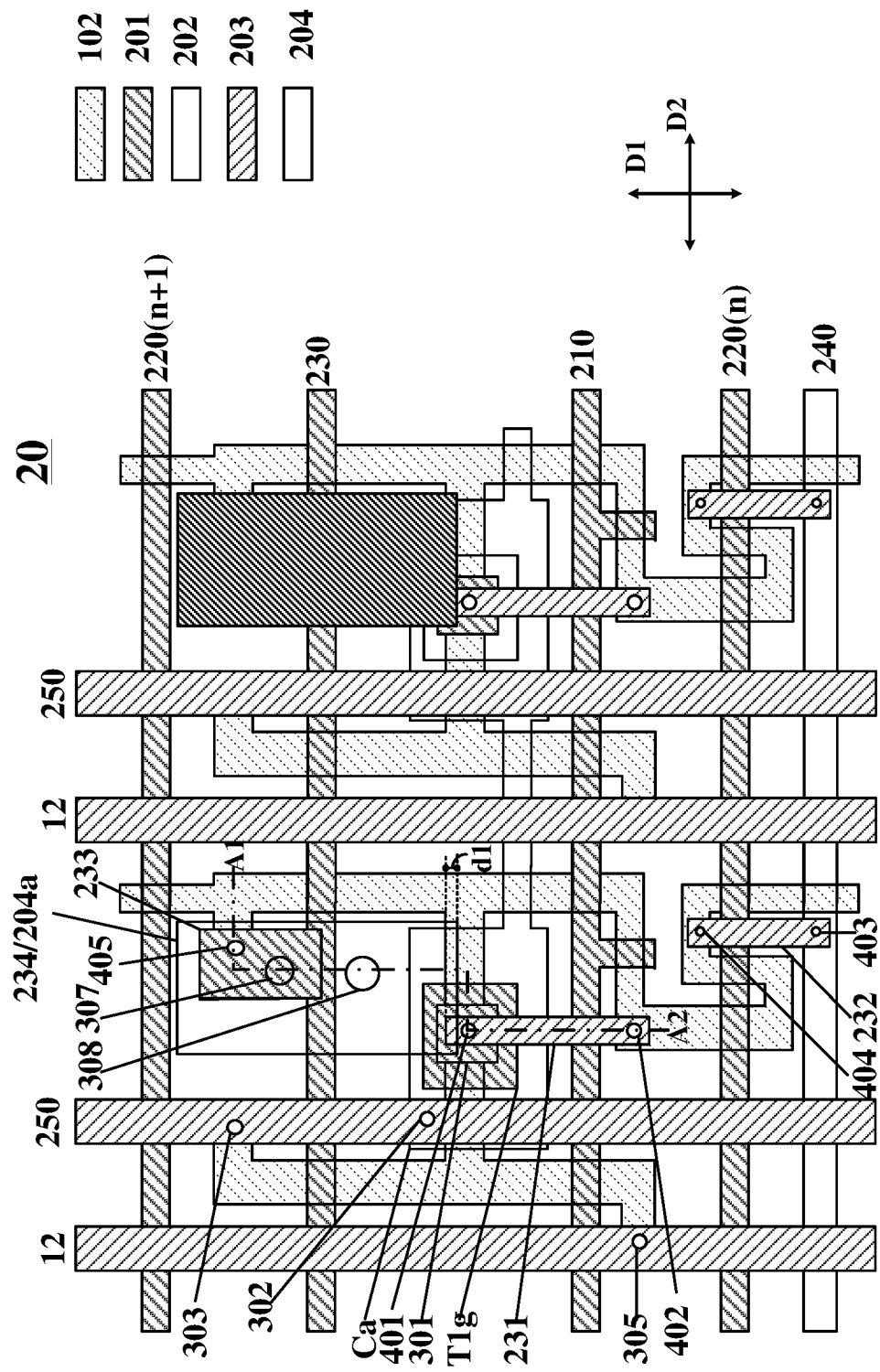
FIG. 2A is a second schematic diagram of a display substrate provided by at least one embodiment of the present disclosure.

FIG. 2A is a schematic diagram of a display substrate 20 provided by at least one embodiment of the present disclosure. The pixel circuits of the plurality of sub-pixels 100 are arranged in a pixel circuit array. The column direction of the pixel circuit array is the first direction D1, the row direction of the pixel circuit array is the second direction D2, and the first direction D1 and the second direction D2 cross with each other. In some embodiments, the pixel circuit of each sub-pixel may have exactly the same structure except for the structure connected with the light-emitting element, that is, the pixel circuit is repeatedly arranged in the row direction and column direction, and structures, connected with the light-emitting elements, of different sub-pixels may be different based on the arrangement shape and position of the electrode of the light-emitting structure of each sub-pixel. In some embodiments, the general frame (for example, the shape and position of each signal line) of the pixel circuit of the sub-pixel for different colors may be basically the same, and the relative positional relationship of each transistor may also be basically the same. However, some signal lines or connection lines may be different in width and shape, or the channel size and shape of some transistors may be different, or the connection lines or via hole positions used for connecting the light-emitting elements of different sub-pixels may be different, which can be adjusted according to each layout structure and sub-pixel arrangement.

FIG. 2A exemplarily shows two adjacent sub-pixels 100 in the same row, and further shows the semiconductor layer 102, the first conductive layer 201, the second conductive layer 202, the third conductive layer 203, and the fourth conductive layer 204. FIG. 2C is an example of a cross-sectional view of FIG. 2A along a section line A1-A2. The semiconductor layer 102, the first insulating layer 103, the first conductive layer 201, the second insulating layer 104, the second conductive layer 202, the third insulating layer 105, the third conductive layer 203, the fourth insulating layer 106, and the fourth conductive layer 204 are sequentially disposed on the base substrate 101, thereby forming the structure of the display substrate as illustrated in FIG. 2A. However, the embodiments of the present disclosure are not limited to this layout.

Figure 2B:
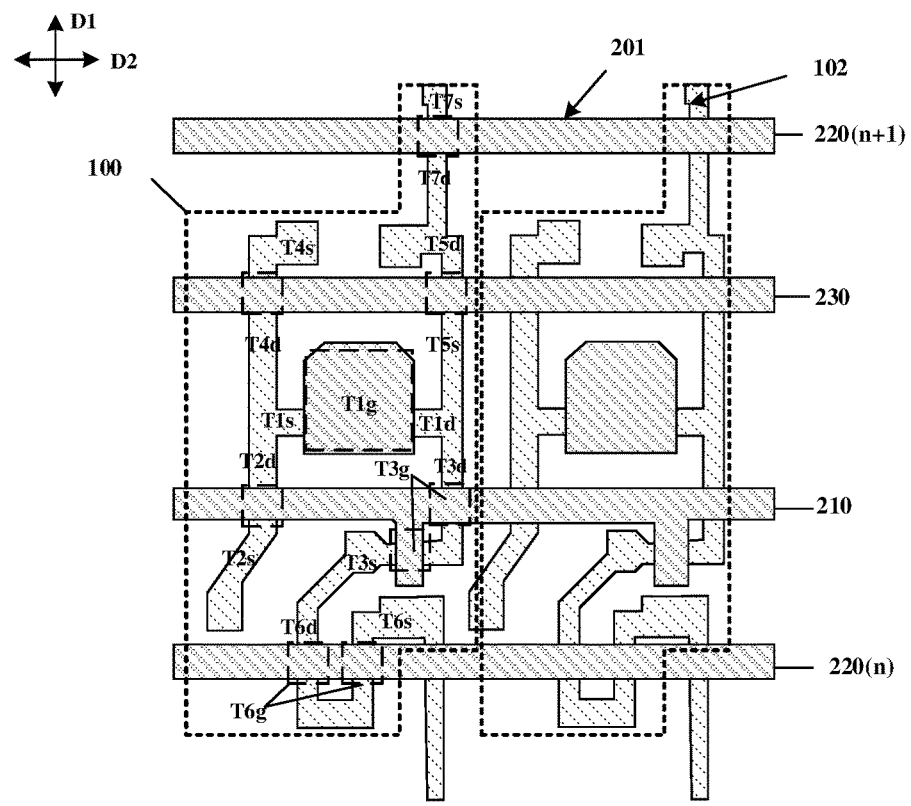
FIG. 2B is a third schematic diagram of a display substrate provided by at least one embodiment of the present disclosure.
Figure 2C:
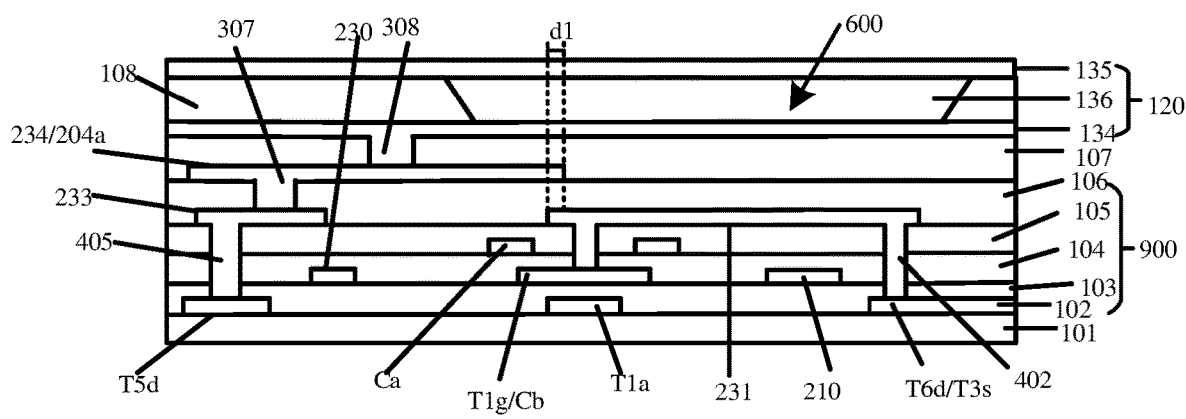
FIG. 2C is an example of a cross-sectional view of FIG. 2A along a section line A1-A2.

FIG. 2B, corresponding to FIG. 2A, shows the semiconductor layer 102 and the first conductive layer (the gate layer) 201 of the transistors T1 to T7 in the two sub-pixels 100, and further shows the gate electrode, first electrode, and second electrode of each transistor. In FIG. 2B, a large dashed frame is used for showing the region where each sub-pixel 100 is located, and a small dashed frame is used for showing the gate electrodes T1g to T7g of the first to seventh transistors T1 to T7 in one sub-pixel 100. For convenience of description, in the following description, Tng, Tns, Tnd, and Tna are respectively used to represent the gate electrode, the first electrode, the second electrode, and the active layer of an n-th transistor Tn, where n is 1 to 7.

Hereinafter, the structure of one sub-pixel of the display substrate provided by at least one embodiment of the present disclosure is exemplarily described with reference to FIG. 2A to FIG. 2C, and for example, structures of other sub-pixels are basically the same as that.

It should be noted that the term "provided or disposed in the same layer" in the present disclosure refers to two (or more than two) structures formed by the same deposition process and patterned by the same patterning process, and materials of the structures may be the same or different. The "integral structure" in the present disclosure refers to two (or more than two) structures, which are connected with each other, formed by the same deposition process and patterned by the same patterning process, and materials of the structures may be the same or different.

For example, as illustrated in FIG. 2A and FIG. 2B, the semiconductor layer 102 includes the active layers T1a to T7a of the first to seventh transistors T1 to T7. As illustrated in FIG. 2B, the active layers T1a to T7a of the first to seventh transistors T1 to T7 are connected to each other as an integral structure. For example, the semiconductor layers 102 of each column of sub-pixels are connected to each other as an integral structure, and the semiconductor layers of two adjacent columns of sub-pixels are spaced apart from each other, so that signal crosstalk between adjacent pixels in the second direction can be avoided.

For example, as illustrated in FIG. 2B, the first conductive layer 201 includes the gate electrodes T1g to T7g of the first to seventh transistors T1 to T7. For example, the third transistor T3 and the sixth transistor T6 adopt the double-gate structure, which can improve the gate control capability of the transistor and reduce the leakage current.

For example, the first conductive layer 104 further includes a plurality of scanning lines 210, a plurality of reset control lines 220, and a plurality of light-emitting control lines 230, which are insulated from each other. For example, each row of sub-pixels may be correspondingly connected to a scanning line 210, a reset control line 220, and a light-emitting control line 230.

The scanning line 210 is electrically connected to the gate electrode of the second transistor T2 of the sub-pixel in the corresponding row (or as an integral structure) to provide the first scanning signal Ga1. The reset control line 220 is electrically connected to the gate electrode of the sixth transistor T6 of the sub-pixel in the corresponding row to provide the first reset signal Rst1. The light-emitting control line 230 is electrically connected to the gate electrode of the fourth transistor T4 of the sub-pixel in the corresponding row to provide the first light-emitting control signal EM1.

For example, as illustrated in FIG. 2A, the scanning line 210 is further electrically connected to the gate electrode of the third transistor T3 (or as an integral structure) to provide the second scanning signal Ga2, that is, the first scanning signal Ga1 and the second scanning signal Ga2 may be the same signal. The light-emitting control line 230 is further electrically connected to the gate electrode of the fifth transistor T5 to provide the second light-emitting control signal EM2, that is, the first light-emitting control signal EM1 and the second light-emitting control signal EM2 may be the same signal.

For example, as illustrated in FIG. 2A, the gate electrode of the seventh transistor T7 of the pixel circuit of the current row is electrically connected to the reset control line 220 (n+1) corresponding to the pixel circuit of the next row (that is, according to the scanning order of scanning lines, the pixel circuit row where the scanning line, sequentially scans subsequent to the current scanning line, is located) to receive the second reset signal Rst2.

For example, with reference to FIG. 2A, the gate line 11 for dividing the pixel region in the column direction (the first direction D1) may be the reset control line 220 or the light-emitting control line 230, and the region of each pixel circuit includes a part of a reset control line 220, a part of a light-emitting control line 230, and a part of a scanning line 210.

For example, as illustrated in FIG. 2B, the display substrate 20 adopts the self-aligned process. The first conductive layer 201 is used as a mask to perform conducting treatment (for example, doping treatment) on the semiconductor layer 102, so that the portion, which is not covered by the first conductive layer 201, of the semiconductor layer 102 is conductive, and thus, the portions, which are located on both sides of the channel region, of the active layer of each transistor are conductive to form the first electrode and the second electrode of the transistor, respectively.

For example, as illustrated in FIG. 2A, the second conductive layer 202 includes the first electrode Ca of the storage capacitor. The first electrode Ca of the storage capacitor overlaps the gate electrode T1g of the first transistor T1 in the direction perpendicular to the base substrate 101 to form the storage capacitor Cst, that is, the gate electrode T1g of the first transistor T1 serves as the second electrode Cb of the storage capacitor Cst. For example, the first electrode Ca of the storage capacitor includes a via hole 301 (an example of the fourth via hole of the present disclosure), and the via hole 301 exposes at least part of the gate electrode T1g of the first transistor T1, so as to facilitate the electrical connection of the gate electrode T1g with other structures.

For example, as illustrated in FIG. 2A, the first electrodes Ca of the storage capacitors of adjacent sub-pixels are electrically connected to each other. Since the first electrode Ca of the storage capacitor of each sub-pixel is electrically connected to the first power line 250 corresponding to the sub-pixel, the first electrodes Ca of the plurality of storage capacitors are connected to each other in the first direction D1, so that the plurality of first power lines 250 can be connected in a mesh structure, which can reduce the resistance and voltage drop of the power lines and allow the first power voltage to be uniformly transmitted to each sub-pixel, thereby improving the uniformity of the display substrate.

For example, as illustrated in FIG. 2A, the second conductive layer 202 may further include a plurality of reset voltage lines 240, and the plurality of reset voltage lines 240 are connected to the plurality of rows of sub-pixels in one-to-one correspondence. The reset voltage line 240 is electrically connected to the first electrode of the sixth transistor T6 of the sub-pixel in the corresponding row to provide the first reset voltage Vinit1.

For example, the first electrode of the seventh transistor T7 of the sub-pixel in the current row may be electrically connected to the reset voltage line 240 corresponding to the next row of sub-pixels, so as to receive the second reset voltage Vinit2.

For example, the third conductive layer 203 includes a first power line 250 extending along the first direction D1, and the first power line 250 is connected to the first voltage terminal VDD and is configured to provide the first power voltage VDD for the plurality of sub-pixels 100. For example, as illustrated in FIG. 2A, the third conductive layer 203 includes the plurality of first power lines 250 electrically connected to the plurality of columns of sub-pixels in one-to-one correspondence. The first power line 250 is electrically connected to the first electrode Ca of the storage capacitor of the sub-pixel in the corresponding column through the via hole 302, and is electrically connected to the first electrode of the fourth transistor T4 through the via hole 303. However, the various embodiments of the present disclosure do not limit the number and arrangement of the first power lines (for example, the corresponding connection with the sub-pixels).

For example, the third conductive layer 203 further includes the plurality of data lines 12. The plurality of data lines 12 are electrically connected to the plurality of columns of sub-pixels in one-to-one correspondence, so as to provide the data signal. For example, the data line 12 is electrically connected to the first electrode T2s of the second transistor T2 of the sub-pixel in the corresponding column through the via hole 305 to provide the data signal.

For example, as illustrated in FIG. 2A, the third conductive layer 203 further includes a connection electrode 231 (an example of the second connection electrode in the present disclosure), one end of the connection electrode 231 is electrically connected to the gate electrode T1g of the first transistor T1, that is, the second electrode Cb of the storage capacitor, through the via hole 301 in the first electrode Ca of the storage capacitor and the via hole 401 in the insulating layer, and the other end of the connection electrode 231 is electrically connected to the first electrode of the third transistor T3 through the via hole 402, so that the second electrode Cb of the storage capacitor is electrically connected to the first electrode T3s of the third transistor T3. For example, as illustrated in FIG. 2C, the via hole 401 penetrates the second insulating layer 104 and the third insulating layer 105, and the via hole 402 penetrates the first insulating layer 103, the second insulating layer 104 and the third insulating layer 105.

For example, as illustrated in FIG. 2A, the third conductive layer 203 further includes a connection electrode 232, one end of the connection electrode 232 is electrically connected to the reset voltage line 240 through the via hole 403, and the other end of the connection electrode 232 is electrically connected to the sixth transistor T6 through the via hole 404, so that the first electrode T6s of the sixth transistor T6 can receive the first reset voltage Vinit1 from the reset voltage line 240. For example, the via hole 403 penetrates the third insulating layer 105, and the via hole 404 penetrates the first insulating layer 103, the second insulating layer 104, and the third insulating layer 105.

For example, as illustrated in FIG. 2A and FIG. 2C, the third conductive layer 203 further includes a connection electrode 233, and the connection electrode 233 is electrically connected to the second electrode T5d of the fifth transistor T5 through the via hole 405 (an example of the third via hole in the present disclosure) and is used to electrically connect the second electrode T5d of the fifth transistor T5 with the first electrode 134 of the light-emitting element. For example, the via hole 405 penetrates the first insulating layer 103, the second insulating layer 104, and the third insulating layer 105. For example, the connection electrode 233 is the contact electrode of the second electrode of the fifth transistor T5.

The fourth conductive layer 204 (an example of the electrical connection layer in the present disclosure) includes a first portion 204a located in the display region DA. As illustrated in FIG. 2A, the first portion 204a includes the plurality of connection electrodes 234 (an example of the first connection electrodes in the present disclosure) provided in one-to-one correspondence with the plurality of sub-pixels 100, respectively, and the pixel circuit of each sub-pixel is electrically connected to the light-emitting element 120 through the connection electrode 234.

It should be noted that the pixel circuit in the embodiments of the present disclosure refers to a circuit structure (such as each transistor structure) located on a side of the fourth conductive layer 204 close to the base substrate 101, so as to be distinguished from the connection electrode 234 in the fourth conductive layer 204, the light-emitting element 120 above the fourth conductive layer 204, or the like.

As illustrated in FIG. 2A and FIG. 2C, the fourth insulating layer 106 is located between the fourth conductive layer 204 and the pixel circuit 900, and the connection electrode 234 is electrically connected to the connection electrode 233 in the third conductive layer 203 through the via hole 307 (an example of the first via hole in the present disclosure) in the fourth insulating layer 106, so as to be electrically connected to the pixel circuit 900 of the sub-pixel. The connection electrode 234 is further configured to be electrically connected to the first electrode 134 of the light-emitting element 120 through the via hole 308 (an example of the second via hole in the present disclosure), so as to electrically connect the light-emitting element with the pixel circuit 900 (for example, the second electrode of the fifth transistor). As illustrated in FIG. 2C, the via hole 308 is located in the fifth insulating layer 107, and the via hole 307 and the via hole 308 do not overlap with each other in the direction perpendicular to the base substrate 101, that is, the orthographic projection of the via hole 307 on the base substrate 101 does not overlap with the orthographic projection of the via hole 308 on the base substrate 101.

Connecting the light-emitting element 120 with the pixel circuit 900 through the connection electrode 234 has various beneficial effects. On one hand, the resistance of the pixel electrode (the first electrode 134) can be reduced to increase the driving current. On the other hand, poor connection, disconnection or unevenness caused by the filling depth of the conductive material for forming the directly-penetrating via hole in the direction perpendicular to the base substrate can be avoided. On the still other hand, the flatness of the first electrode 134 of the light-emitting element 120 affects the light-emitting uniformity of the light-emitting layer. By providing the fourth conductive layer 204 to space the pixel circuit 900 in the lower-layer from the light-emitting element in the upper-layer, the influence of the pixel circuit 900 in the lower-layer on the flatness of the first electrode 134 can be reduced. For example, as illustrated in FIG. 2C, since the via hole 405 is relatively deep, the distance between the via hole 405 and the first electrode 134 can be increased in the longitudinal direction by providing the connection electrode 234, thereby reducing the effect of the via hole 405 on the flatness of the first electrode.

In addition, the via hole 307 and the via hole 308 are designed so as not to overlap in the direction perpendicular to the base substrate 101, which may facilitate dispersing the influence of multiple via holes in the longitudinal direction and improving the flatness of the first electrode 134.

For example, as illustrated in FIG. 2C, the via hole 405, the via hole 307, and the via hole 308 do not overlap with each other in the direction perpendicular to the base substrate 101, that is, the orthographic projection of the via hole 405 on the base substrate 101, the orthographic projection of the via hole 307 on the base substrate 101, and the orthographic projection of the via hole 308 on the base substrate 101 do not overlap with each other.

As illustrated in FIG. 2A, the portion of the fourth conductive layer 204 located in the display region DA (that is, the first portion of the fourth conductive layer 204) does not overlap with any one first power line 250 in the direction perpendicular to the base substrate 101.

The inventors found that the resistance and capacitance load caused by the resistance and parasitic capacitance on the first power line 250 has an important impact on the uniformity and stability of the power voltage signal on the power line, and further affects the uniformity of display. The inventors further found that for the display region DA of the display substrate, compared to reducing the resistance of the first power line 250, reducing the parasitic capacitance is more helpful to improve the display effect of the display region. The first portion of the fourth conductive layer located in the display region DA (that is, the entire pattern of the fourth conductive layer located in the display region) does not overlap with any one first power line 250 in the direction perpendicular to the base substrate 101, which may effectively reduce the parasitic capacitance of the first power line and improve the display effect.

For example, the fourth conductive layer 204 may further include a second portion located in the non-display region NDA, the second portion of the fourth conductive layer 204 may be provided in parallel connection with the conductive structure located in the non-display region NDA to reduce the resistance of the conductive structure, and for example, the conductive structure is a signal line, an electrode of a device, or the like. Details are described in the following.

As illustrated in FIG. 2A, the orthographic projection of the via hole 307 on the base substrate 101 and the orthographic projection of the via hole 308 on the base substrate 101 are both located within the orthographic projection of the third connection electrode 234 on the base substrate 101. For example, the via hole 307 and the via hole 308 are arranged side by side in the first direction D1 and center lines of the via hole 307 and the via hole 308 along the first direction D1 approximately coincide with each other. In this way, the size of the connection electrode 234 in the second direction D2 can be reduced, and the overlapping of the connection electrode 234 with the first power line 250 can be avoided.

For example, as illustrated in FIG. 2C, the display substrate 20 further includes a pixel definition layer 108 on the first electrode of the light-emitting element. An opening is formed in the pixel definition layer 108 to define the opening region 600 of the display substrate. The light-emitting layer 136 is formed at least within the opening (the light-emitting layer 136 may further cover part of the pixel definition layer), and the second electrode 135 is formed on the light-emitting layer 136, so as to form the light-emitting element 120. For example, the second electrode 135 is a common electrode and provided in the entire surface in the display substrate 20. For example, the first electrode is the anode of the light-emitting element, and the second electrode is the cathode of the light-emitting element.

As illustrated in FIG. 2C, the opening region 600 does not overlap with the via hole 307 and via hole 308 in the direction perpendicular to the base substrate 101 to improve the flatness of the light-emitting layer.

In other examples, in the direction parallel to the surface of the base substrate 101, the via hole 308 is farther away from the opening region 600 of the sub-pixel than the via hole 307 (for example, the area of the first electrode 134 is larger than the area of the corresponding opening region 600, and the opening region 600 is approximately located in the middle region of the first electrode 134), that is, the orthographic projection of the via hole 308 on the base substrate 101 is farther away from the orthographic projection of the opening region 600 on the base substrate 101 than the orthographic projection of the via hole 307 on the base substrate 101. This is because in the direction perpendicular to the base substrate 101, the fifth insulating layer 107 (for example, the second planarization layer) where the via hole 308 is located, is closer to the opening region 600 than the fourth insulating layer 106 (for example, the first planarization layer) where the via hole 307 is located. Therefore, the via hole 308 has a greater impact on the flatness of the portion of the first electrode 134 exposed to the opening region (that is, the portion, used to contact the light-emitting layer, of the first electrode 134), and allowing the via hole 308 to be farther away from the opening region (on the surface parallel to the base substrate) can reduce the influence of the via hole on the flatness of the light-emitting layer 136 in the opening region and improve the performance of the light-emitting element.

In still other examples, the via hole 307 may partially overlap with the opening region 600, and at least the fourth conductive layer 204 and the fifth insulating layer 107 where the via hole 308 is located are provided to separate the layer where the via hole 307 is located from the layer where the first electrode 134 is located, so that the influence of the via hole 307 on the flatness of the opening region is smaller than the influence of the via hole 308 on the flatness of the opening region.

For example, as illustrated in FIG. 2A and FIG. 2C, the orthographic projections of the via hole 307 and the via hole 308 on the base substrate are respectively located on both sides of the orthographic projection of the light-emitting control line 230 of the sub-pixel 100 on the base substrate. This arrangement can prevent the signal on the light-emitting control line 230 from interfering with the signal on the pixel electrode.

For example, as illustrated in FIG. 2C, since the connection electrode 234 needs to extend in the direction away from the via hole 307 to be electrically connected to the first electrode 134 through the via hole 308, in order to avoid poor connection at the via hole 308, the connection electrode 234 usually extends a sufficient distance in the lateral direction, so as to realize sufficient contact with the first electrode 134. Since the layout design is relatively compact, this arrangement causes the connection electrode 234 to overlap with the connection electrode 231 in the direction perpendicular to the base substrate 101, which generates parasitic capacitance. However, errors generally occur when the patterning process is performed on each material layer to form a pattern. For example, in the photolithography process, alignment errors are prone to occur during the exposure phase; and in the etching process, the actual size of the pattern obtained by etching is smaller than the design value, and there is a difference between the design value and the actual value (i.e., "CD bias"). In order to ensure the uniformity of each sub-pixel, the process can be designed to ensure that the parasitic capacitance exists in each sub-pixel, thereby improving the uniformity of display.

For example, as illustrated in FIG. 2A and FIG. 2C, in the first direction D1, the overlapping dimension d1 of the orthographic projection of the connection electrode 234 on the base substrate 101 and the orthographic projection of the connection electrode 231 on the base substrate 101 satisfies:

$$d1 \geq \sqrt{(cd\text{bias}1)^2 + (cd\text{bias}2)^2},$$

where cdbias1 is the difference between the design value and the actual value of the third conductive layer 203 where the connection electrode 231 is located, and cdbias2 is the difference between the design value and the actual value of the fourth conductive layer 204 where the connection electrode 234 is located. The specific values of cdbias1 and cdbias2 depend on the process capability. For example, cdbias1 and cdbias2 are both between 0.1 μm and 0.9 μm. With this arrangement, the connection electrode 234 and the connection electrode 231 of each sub-pixel can overlap with each other in the direction perpendicular to the base substrate 101 under the condition of process fluctuations, thereby improving uniformity.

Figure 3:
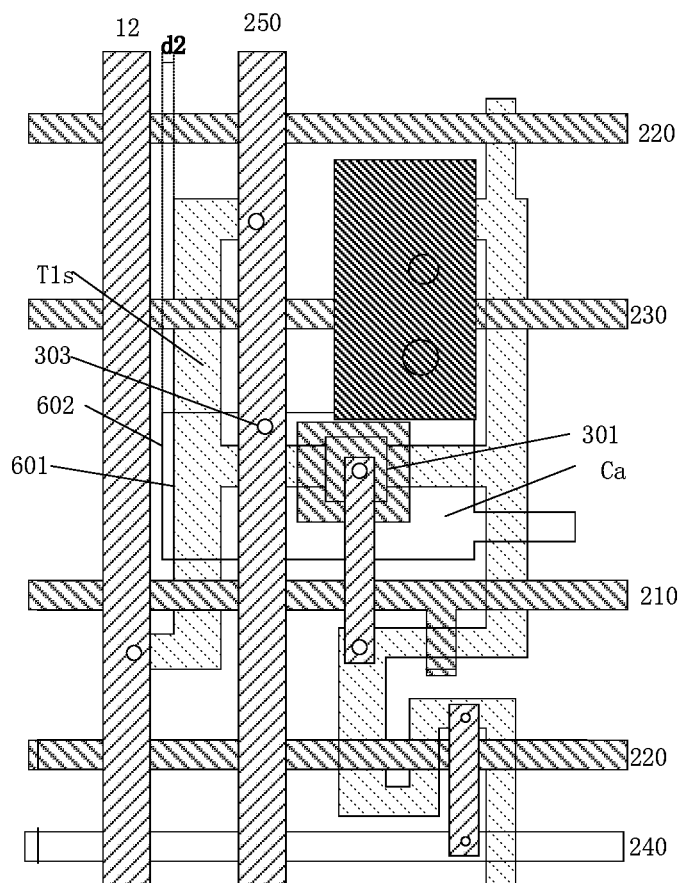
FIG. 3 is a fourth schematic diagram of a display substrate provided by at least one embodiment of the present disclosure.

FIG. 3 is a schematic diagram of a display substrate provided by other embodiments of the present disclosure. As illustrated in FIG. 3, the first electrode Ca of the storage capacitor overlaps with the first electrode T1s of the first transistor T1 in the direction perpendicular to the base substrate 101. Since in the second direction D2, the first power line 250 is located between the data line 12 and the via hole 301 in the first electrode Ca of the storage capacitor, and is electrically connected to the first electrode Ca of the storage capacitor through the via hole 303, the first electrode Ca of the storage capacitor needs to extend fully toward the data line 12 to ensure good connection with the first power line 250. For example, the first electrode T1s of the first transistor T1 has a first electrode side 601 close to the data line 12 along the first direction D1, and the first electrode Ca of the storage capacitor has a capacitor electrode side 602 which is close to the data line 12 and is along the first direction D1. For example, in the first direction D1, the first electrode side 601 is the side, which is closest to the data line 12, of the first electrode T1s of the first transistor T1, and the capacitor electrode side 602 is the side, which is closest to the data line 12, of the first electrode Ca of the storage capacitor.

For example, in the second direction D2, the capacitor electrode side 602 is closer to the data line 12 than the first electrode side 601, that is, the capacitor electrode side 602 extends beyond the first electrode side 601.

For example, in order to prevent process fluctuations from causing uneven overlapping area of the first electrode Ca of the storage capacitor and the first electrode T1s of the first transistor T1 in the direction perpendicular to the base substrate 101, which causes uneven parasitic capacitance, the process is designed to ensure that in each sub-pixel, the capacitor electrode side 602 extends beyond the first electrode side 601.

For example, as illustrated in FIG. 3, in the second direction D2, the distance d2 between the orthographic projection of the capacitor electrode side 602 on the base substrate 101 and the orthographic projection of the first electrode side 601 on the base substrate 101 satisfies:

$$d2 \geq \sqrt{(cd\text{bias}3)^2 + (cd\text{bias}4)^2},$$

where cdbias3 is the difference between the design value and the actual value of the semiconductor layer 201 where the first electrode T1s of the first transistor T1 is located, and cdbias4 is the difference between the design value and the actual value of the second conductive layer 202 where the first electrode Ca of the storage capacitor is located. The specific values of cdbias3 and cdbias4 depend on the process capability. For example, cdbias3 and cdbias4 are both between 0.1 μm and 0.9 μm. With this arrangement, it can be ensured that in the case of process fluctuations, the capacitor electrode side 602 exceeds the first electrode side 601 in each sub-pixel, thereby improving uniformity.

Figure 4A:
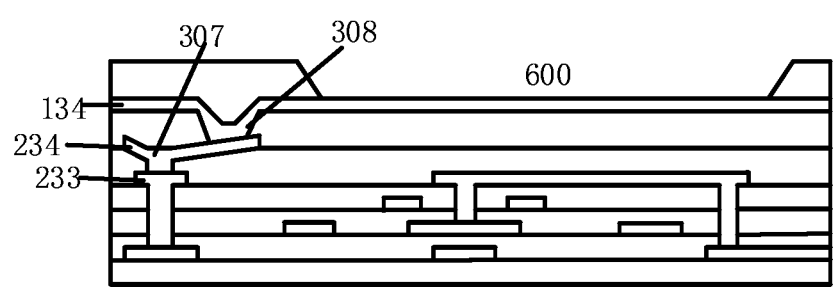
FIG. 4A is another example of a cross-sectional view of FIG. 2A along the section line A1-A2.

In other examples, as illustrated in FIG. 4A, the portion of the connection electrode 234 exposed by the via hole 308 has an inclined surface with respect to the base substrate 101. On one hand, this arrangement can increase the contact area between the first electrode 134 of the light-emitting element 120 and the connection electrode 234 in the same space, thereby reducing the contact resistance and improving the yield. On the other hand, in the case where the display substrate 20 is a flexible display substrate, the inclined surface arrangement can relieve the bending stress at the via hole 308 by and improve the bending resistance of the substrate. For example, the inclination direction of the connection electrode 234 of the sub-pixel is consistent with the bending direction of the substrate region where the sub-pixel is located, thereby alleviating the bending stress. For example, the inclination angle of the inclined surface relative to the base substrate is between 20 degrees and 50 degrees.

Figure 4B:
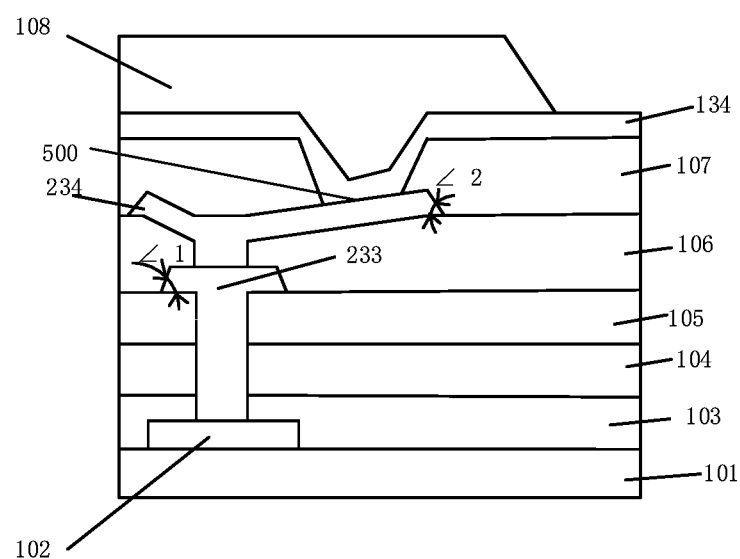
FIG. 4B is still another example of a cross-sectional view of FIG. 2A along the section line A1-A2.

FIG. 4B shows an enlarged schematic view of the via hole 308 in FIG. 4A. For example, as illustrated in FIG. 4B, the connection electrode 233 has a first slope angle $\angle 1$, and the connection electrode 234 has a second slope angle $\angle 2$ at the end close to the via hole 308. Assuming that the connection electrode 233 is formed on the flat surface of the third insulating layer 105, $\angle 1$ is greater than or equal to 55 degrees and less than or equal to 70 degrees, $\angle 2$ is greater than or equal to 60 degrees and less than or equal to 80 degrees, and $\angle 1$ is less than $\angle 2$, so that the inclined surface 500 of the connection electrode 234 is provided, and further the connection electrode 234 and the first electrode 134 of the light-emitting element 120 may have a better contact effect and electrical connection effect. In addition, this arrangement also facilitates improving the etching rate and etching effect of etching the third conductive layer 203 and the fourth conductive layer 204 to form the connection electrode 233 and the connection electrode 234, respectively.

Figure 5:
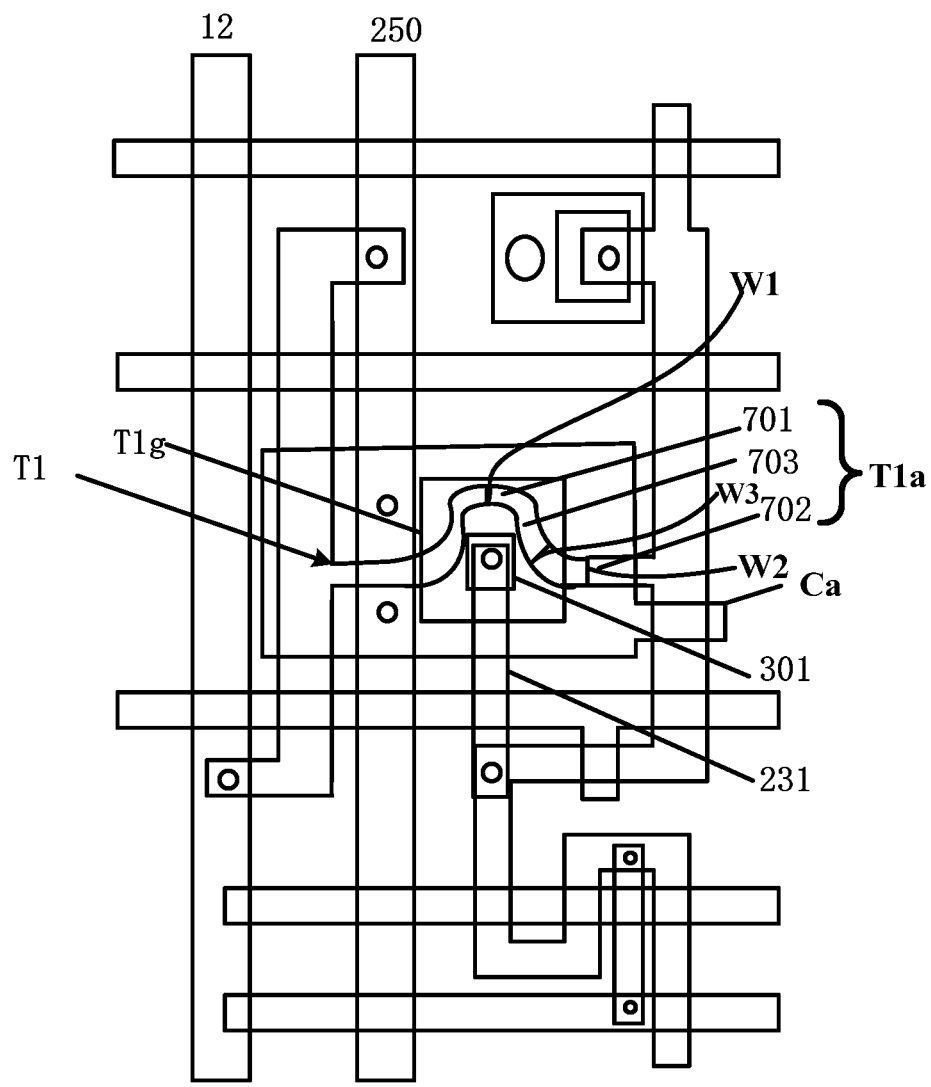
FIG. 5 is a fifth schematic diagram of a display substrate provided by at least one embodiment of the present disclosure.

FIG. 5 is a schematic diagram of a display substrate provided by still other embodiments of the present disclosure. As illustrated in FIG. 5, the active layer T1a of the first transistor T1 includes a bending structure. With this arrangement, the width-to-length ratio W/L of the channel region of the first transistor T1 can be reduced.

Since the first transistor T1 is a driving transistor of the pixel circuit, a larger size is generally designed to obtain a sufficiently large driving current. However, the inventors found that the excessive driving current may cause gray scale loss, for example, the inability to display low gray scale data which causes image distortion. This problem can be solved by reducing the width-to-length ratio of the first transistor T1, and the display effect can be improved.

For example, the active layer T1a of the first transistor T1 is in a Q shape, or is similar to the Q shape, that is, includes a protruding structure. As illustrated in FIG. 5, the active layer T1a includes a first portion 701, a second portion 702, and a connection portion 703. The second portion 702 is provided on both sides of the first portion 701, and the first portion 701 is a protruding portion. The connection portion 703 connects the first portion 701 and the second portion 702.

For example, the first portion 701 and the second portion 702 are both straight and not on the same horizontal line, and the second portion 702 is arc-shaped. For example, the average radius of curvature of the second portion 702 is greater than 1 μm.

As illustrated in FIG. 5, the average width W3 of the connection portion 703 is larger than the average width W1 of the first portion 701 and the average width W2 of the second portion 702. This is because the arc-shaped connection portion 703 is easier to break during the formation process than the linear structure. By making the connection portion 703 wider, the process yield can be improved.

For example, as illustrated in FIG. 5, the via hole 301 in the first electrode Ca of the storage capacitor does not overlap with the active layer T1a of the first transistor T1 in the direction perpendicular to the base substrate. For example, by providing the above-mentioned protruding structure in the active layer T1a, the active layer T1a and the via hole 301 do not overlap in the direction perpendicular to the base substrate. This design can avoid the portion of the gate electrode T1g of the first transistor T1 exposed by the via hole 301, that is, the portion in contact with the connection electrode 231, from being uneven due to the active layer T1a of the first transistor T1, thereby improving the contact yield of the connection electrode 231 and the gate electrode T1g.

The gate driving circuit 13 of the display substrate 20 usually includes a plurality of shift register units. The shift register unit generates a shift pulse signal under the action of the control signal of the external circuit, and the shift pulse signal serves as the scanning signal of the current row of pixels and further serves as the start signal of the next row (the first row is triggered by the frame start signal STV) and the end signal of the previous row for control. For example, the control signal of the external circuit mainly includes a frame start signal (STV), a pair of CLK and CLKB signals with opposite phases, a transistor turn-off signal (such as VGL), and possible DC voltage signals VGH and VGL. The plurality of shift register units are connected in one-to-one correspondence with the plurality of rows of sub-pixels in the display region, and are configured to output the above-mentioned first scanning signal Ga1 and second scanning signal Ga2 to the corresponding row of sub-pixels through output nodes.

Figure 6A:
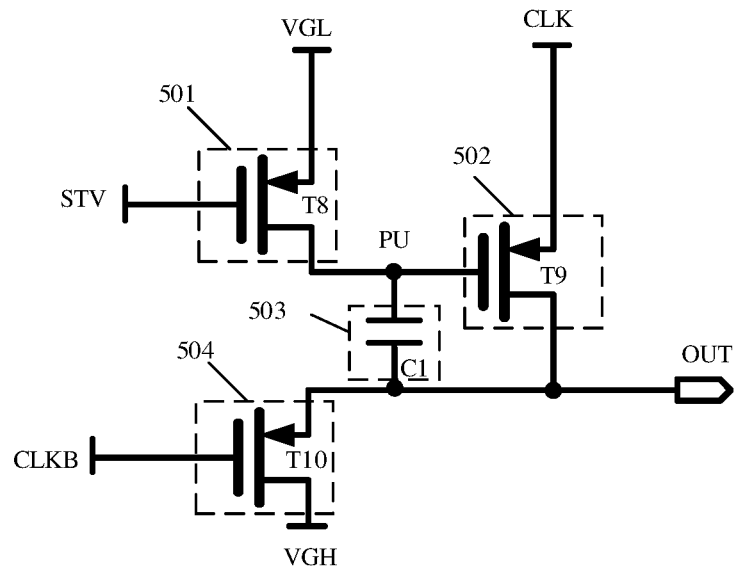
FIG. 6A is a schematic diagram of a gate driving circuit provided by at least one embodiment of the present disclosure.

FIG. 6A shows a schematic circuit diagram of a gate driving circuit provided by at least one embodiment of the present disclosure, and the figure shows a shift register unit in the gate driving circuit. As illustrated in FIG. 6A, the shift register unit includes an input circuit 501, an output circuit 502, a storage circuit 503, and a reset circuit 504. The input circuit 501 is configured to transmit a high potential VGH to a pull-up node PU, that is, the control terminal of the output circuit 502 and one terminal of the storage circuit 503, in response to the trigger signal STY. The output circuit 502 is configured to output the CLK signal under the control of the pull-up node PU. The reset circuit 504 is configured to reset the output node OUT in response to the CLKB signal.

For example, the input circuit 501 includes an eighth transistor T8, the output circuit 502 includes a ninth transistor T9, the reset circuit 504 includes a tenth transistor T10, and the storage circuit 503 includes a first capacitor C1. The first capacitor C1 is connected to the output node OUT and includes a first electrode C1a and a second electrode C1b. The working process of the shift register unit is exemplarily described below by taking the P-type transistor as an example, but the embodiments of the present disclosure are not limited thereto.

The working process of the shift register unit includes: when the trigger signal STV comes, the CLK signal is at a high potential, the eighth transistor T8 is turned on, the low potential VGL is transmitted to the gate electrode (the pull-up node PU) of the ninth transistor T9 and simultaneously stored in the first electrode of the first capacitor C1, and the ninth transistor T9 is turned on under the action of the low potential VGL and outputs the low potential CLK signal to turn on the transistors of the sub-pixel in the current row, which further serves as the input signal of the next shift register unit. As the potential of the CLK signal changes from low to high, the tenth transistor T10 is turned on under the action of the low potential CLKB signal, and the first capacitor C1 is discharged to output a high potential, which turns off the transistors of the sub-pixel in the current row. In this way, the progressive scanning of the sub-pixels in the display region can be achieved.

Figure 6B:
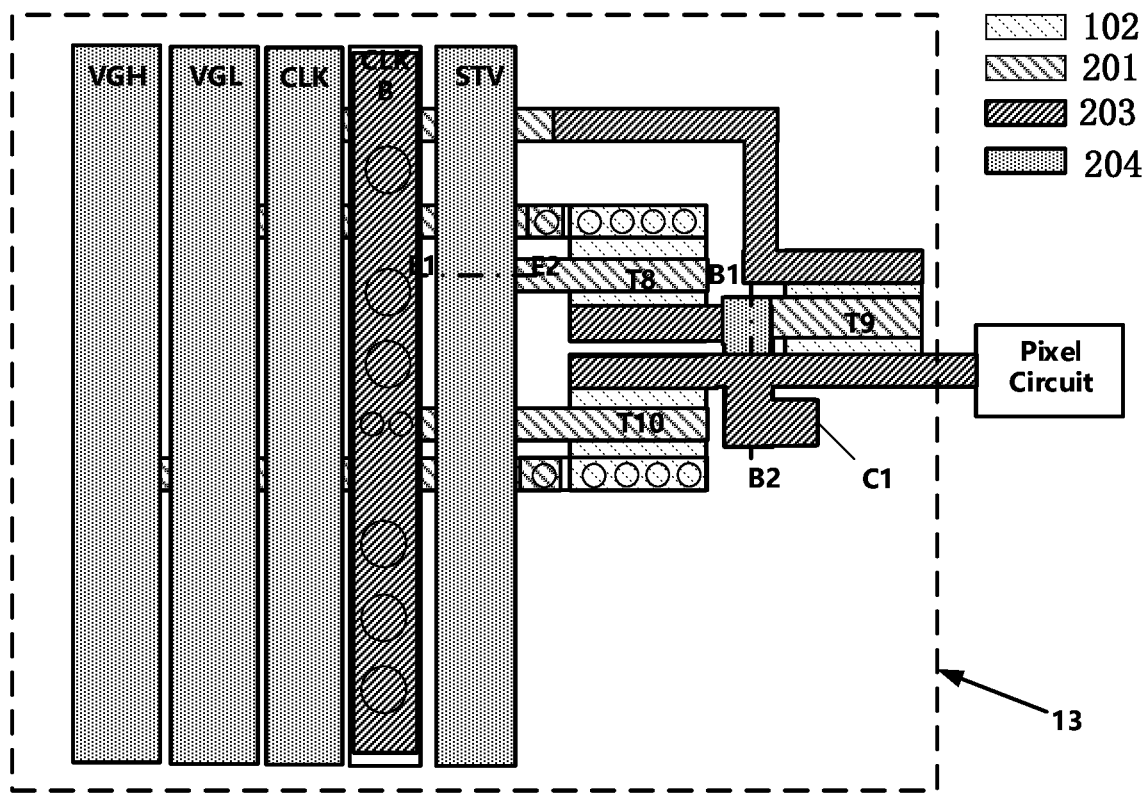
FIG. 6B is a sixth schematic diagram of a display substrate provided by at least one embodiment of the present disclosure.
Figure 6C:
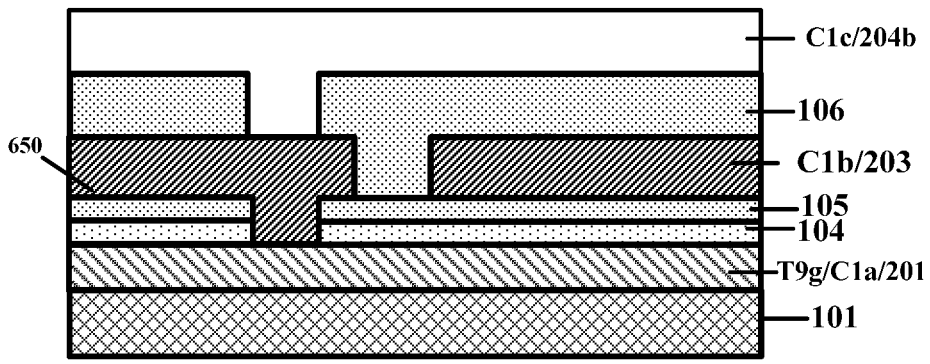
FIG. 6C is a cross-sectional view of FIG. 6B along a section line B1-B2.
Figure 6D:
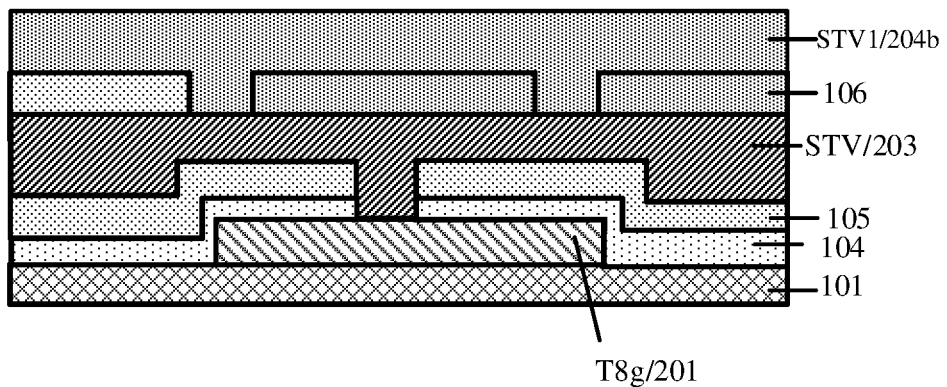
FIG. 6D is a cross-sectional view of FIG. 6B along a section line E1-E2.

FIG. 6B shows a schematic structural diagram of the shift register unit shown in FIG. 6A, FIG. 6C is a cross-sectional view along the section line B1-B2 in FIG. 6B, and FIG. 6D is a cross-sectional view along the section line E1-E2 in FIG. 6B. It should be noted that, for the sake of clarity, the structures under the first conductive layer 201 (such as the first insulating layer and the semiconductor layer) are omitted in FIG. 6B and FIG. 6C.

As illustrated in FIG. 6B, the display substrate 20 includes a first power signal line VGH, a second power signal line VGL, a trigger signal line STV, a first clock signal line CLK, and a second clock signal line CLKB located in the non-display region NDA. For example, each signal line extends in the first direction.

The first power signal line VGH is electrically connected to the first electrode of the eighth transistor T8 to provide the first power signal VGH, and the second power signal line VGL is electrically connected to the first electrode of the tenth transistor T10 to provide the second power signal VGL. The first clock signal line CLK is electrically connected to the first electrode of the ninth transistor to provide the first clock signal CLK, and the second clock signal line CLKB is electrically connected to the gate electrode of the tenth transistor T10 to provide the second clock signal CLKB. The trigger signal line STV is electrically connected to the gate electrode of the eighth transistor T8 to provide the trigger signal STY.

The gate driving circuit 13 can be formed through the same process as the sub-pixel in the display region. For example, the gate electrodes of the eighth to tenth transistors T8 to T10 may be located in the first conductive layer 201, the active layer, the first electrode, and the second electrode may be located in the semiconductor layer 102, and each signal line of the non-display region NDA may be located in the third conductive layer 203.

As illustrated in FIG. 6B and FIG. 6C, the second electrode of the eighth transistor T8 is electrically connected to the gate electrode T9g of the ninth transistor T9 and the first electrode C1a of the first capacitor C1 through the connection electrode 650, and the second electrode C1b of the first capacitor C1 is insulated from the connection electrode 650 in the same layer. For example, the connection electrode 650 and the second electrode C1b of the first capacitor C1 may be located in the third conductive layer 203.

For example, as illustrated in FIG. 6B, each signal line is connected to the gate driving circuit 13 through the wiring pattern in the first conductive layer 201, and the gate driving circuit 13 is connected to the pixel circuit in the display region DA through the wiring pattern in the third conductive layer 203.

For example, the second portion 204b of the fourth conductive layer 204 located in the non-display region includes an auxiliary capacitor electrode C1c, and the auxiliary capacitor electrode C1c may be connected in parallel with the first electrode C1a or the second electrode C1b of the first capacitor C1 to increase the capacitance value of the first capacitor C1.

As illustrated in FIG. 6C, the auxiliary capacitor electrode C1c is electrically connected to the connection electrode 650 through the via hole penetrating the third insulating layer, so as to be electrically connected to the first electrode C1a of the first capacitor C1, and overlaps with the second electrode C1b of the first capacitor C1 in the direction perpendicular to the base substrate 101. Thus, the first electrode C1a and the auxiliary capacitor electrode C1c respectively at least partially overlap with the second electrode C1b to form a parallel capacitor structure, thereby increasing the capacitance value of the first capacitor C1, improving the bootstrap capability of the first capacitor C1, and further improving the stability of the output signal.

For example, as illustrated in FIG. 6B, the second portion 204b of the fourth conductive layer 204 in the non-display region further includes auxiliary signal lines corresponding to the signal lines. Each auxiliary signal line is connected in parallel with each signal line to reduce the resistance of the signal line and the voltage drop of the signal line. Each auxiliary signal line overlaps with the corresponding signal line in the direction perpendicular to the base substrate 101, and the connection is in parallel through the via hole.

Hereinafter, the auxiliary signal line of the trigger signal line STV is exemplarily described in conjunction with FIG. 6B and FIG. 6D.

As illustrated in FIG. 6B, the trigger signal line STV is electrically connected to the gate electrode T8g of the eighth transistor T8 through the via hole. For example, the second portion 204b of the fourth conductive layer 204 in the non-display region further includes an auxiliary trigger signal line STV1, which is connected in parallel with the trigger signal line STV through the via hole penetrating the third insulating layer.

For example, the second portion 204b of the fourth conductive layer 204 located in the non-display region further includes the bonding electrode 80, that is, the bonding electrode 80 is located in the fourth conductive layer 204.

Figure 7A:
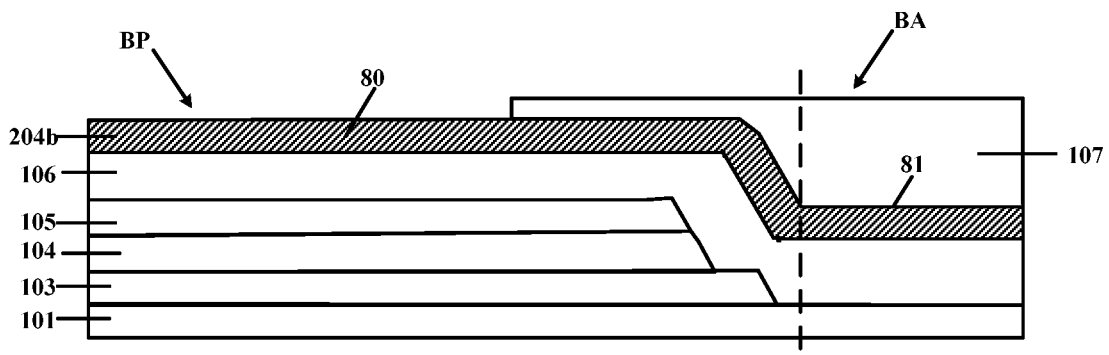
FIG. 7A is an example of a cross-sectional view of FIG. 1A along a section line D1-D2.

FIG. 7A is an example of a cross-sectional view of FIG. 1A along the section line D1-D2. As illustrated in FIG. 1A and FIG. 7A, for example, the second portion 204b of the fourth conductive layer 204 located in the non-display region further includes a wire 81 located in the non-display region. One end of the wire 81 is connected to the bonding electrode 80, for example, connected as an integral structure; and the other end of the wire 81 extends to the display region. As illustrated in FIG. 7A, the wire 81 and the bonding electrode are located on the fourth insulating layer 106, and the fifth insulating layer 107 covers the wire 81 and exposes the bonding electrode 80 to facilitate bonding with the external circuit. As illustrated in FIG. 7A, a part of the wire 81 is located in the bending region BA. For example, because inorganic materials are brittle and easy to break under bending, in order to improve the bending resistance of the substrate, it is usually necessary to remove the inorganic insulating material in the bending region BA (that is, to form an opening in the inorganic insulating material) and fill the opening with the inorganic material with better toughness.

For example, the first insulating layer 103, the second insulating layer 104, and the third insulating layer 105 are, for example, inorganic insulating layers, including silicon oxides, such as silicon oxide, silicon nitride, and silicon oxynitride, silicon nitrides or oxide nitrides, aluminum oxide, titanium nitride, or other metal oxynitride insulating materials. For example, the fourth insulating layer 106, the fifth insulating layer 107, and the pixel definition layer 108 are respectively organic insulating materials, such as polyimide (PI), acrylate, epoxy resin, polymethylmethacrylate (PMMA), or other organic insulating materials. For example, the fourth insulating layer 106 and the fifth insulating layer 107 are planarization layers.

In this case, as illustrated in FIG. 7A, in the bending region BA, the first insulating layer 103, the second insulating layer 104, and the third insulating layer 105 are all removed, and the fourth insulating layer 106 and the fifth insulating layer 107 remain. The portion of the fourth insulating layer 106 located in the bending region BA (an example of the bent portion of the organic insulating layer in the present disclosure) is filled between the wire 81 and the base substrate 101, and is in direct contact with the base substrate 101, thereby improving the bending resistance of the wire 81 and reducing the risk of wire breakage. The fifth insulating layer 107 covers the wire 81 to protect the wire 81.

Since the fourth conductive layer is present in the display substrate provided by at least one embodiment of the present disclosure, the fourth insulating layer and the fifth insulating layer are both existing structures in the display substrate, and no additional process needs to be provided.

Figure 7B:
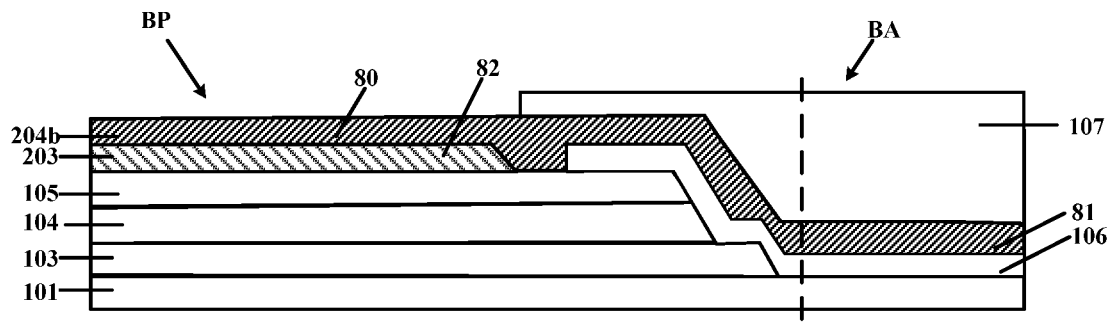
FIG. 7B is another example of a cross-sectional view of FIG. 1A along the section line D1-D2.

FIG. 7B is another example of a cross-sectional view of FIG. 1A along the section line D1-D2. The difference between the embodiment shown in FIG. 7B and the embodiment shown in FIG. 7A is that the display substrate 20 shown in FIG. 7B further includes an auxiliary bonding electrode 82 located in the non-display region NDA, and the auxiliary bonding electrode 82 is located on a side of the bonding electrode 80 close to the base substrate 101 and is connected in parallel with the bonding electrode 80 to reduce the resistance.

For example, as illustrated in FIG. 7B, the bonding electrode 80 and the auxiliary bonding electrode 82 are in direct contact and electrical connection (lapped), that is, the fourth insulating layer 106 between the auxiliary bonding electrode 82 and the bonding electrode 80 is removed. For example, the bonding electrode 80 covers at least one side of the auxiliary bonding electrode 82, which can reduce the contact resistance.

For example, the auxiliary bonding electrode 82 may be provided in the same layer as any conductive layer located below the fourth conductive layer in the display region DA. For example, the auxiliary bonding electrode 82 is located in the third conductive layer 203, that is, is provided in the same layer as the first power line 250.

For example, in different embodiments, the base substrate 101 may be a rigid substrate, such as a glass substrate, a silicon substrate, etc., or may be formed of a flexible material with excellent heat resistance and durability, such as polyimide (PI), polycarbonate (PC), polyethylene terephthalate (PET), polyethylene, polyacrylate, polyarylate, polyetherimide, polyethersulfone, polyethylene glycol phthalate (PET), polyethylene (PE), polypropylene (PP), polysulfone (PSF), polymethyl methacrylate (PMMA), cellulose triacetate (TAC), cyclic olefin polymer (COP), cyclic olefin copolymer (COC), etc.

For example, the material of the semiconductor layer 102 includes, but is not limited to, silicon-based materials (a-Si, polysilicon, p-Si, etc.), metal oxide semiconductors (IGZO, ZnO, AZO, IZTO, etc.), and organic materials (hexathiophene, polythiophene, etc.).

For example, the material of the first to fourth conductive layers may include gold (Au), silver (Ag), copper (Cu), aluminum (Al), molybdenum (Mo), magnesium (Mg), tungsten (W), and the alloy materials made of combinations of above metals, and may also include conductive metal oxide materials, such as indium tin oxide (ITO), indium zinc oxide (IZO), zinc oxide (ZnO), zinc aluminum oxide (AZO), etc.

For example, the light-emitting element 120 has a top-emitting structure, the first electrode 134 has reflectivity, and the second electrode 135 has transmissive or semi-transmissive properties. For example, the first electrode 134 is a material with high work function to act as the anode, such as an ITO/Ag/ITO laminate structure; and the second electrode 135 is a material with low work function to act as the cathode, such as a semi-transmissive metal or metal alloy, including an Ag/Mg alloy material.

At least one embodiment of the present disclosure further provides a display panel including any one of the above display substrates 20. It should be noted that the above-mentioned display substrate 20 provided by at least one embodiment of the present disclosure may include the light-emitting element 120, or may not include the light-emitting element 120, that is, the light-emitting element 120 may be formed in a panel factory after the display substrate 20 is completed. In the case that the display substrate 20 does not include the light-emitting element 120, the display panel provided by at least one embodiment of the present disclosure further includes the light-emitting element 120 in addition to the display substrate 20.

Figure 8:
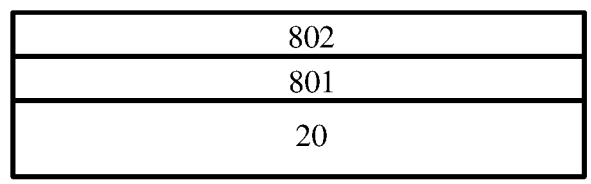
FIG. 8 is a schematic diagram of a display panel provided by at least one embodiment of the present disclosure.

For example, the display panel is an OLED display panel, and accordingly the display substrate 20 included therein is an OLED display substrate. As illustrated in FIG. 8, for example, the display panel 30 further includes an encapsulation layer 801 and a cover plate 802 disposed on the display substrate 20. The encapsulation layer 801 is configured to seal the light-emitting element on the display substrate 20 to prevent the penetration of external moisture and oxygen into the light-emitting element and the driving sub-circuit from causing damage to the device. For example, the encapsulation layer 801 includes an organic thin film or a structure in which an organic thin film and an inorganic thin film are alternately stacked. For example, a water absorption layer (not shown) may be further provided between the encapsulation layer 801 and the display substrate 20, and is configured to absorb residual water vapor or sol in the preliminary manufacturing process of the light-emitting element. For example, the cover plate 802 is a glass cover plate. For example, the cover plate 802 and the encapsulation layer 801 may be an integral structure.

Figure 9:
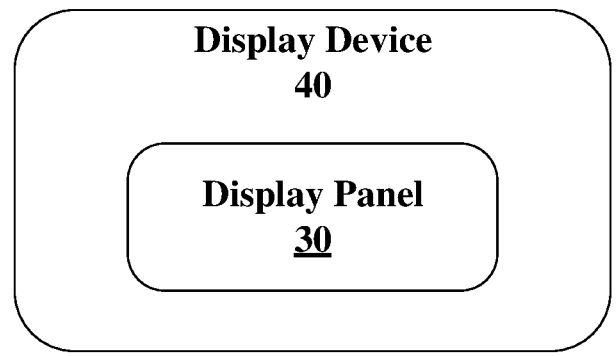
FIG. 9 is a schematic diagram of a display device provided by at least one embodiment of the present disclosure.

At least one embodiment of the present disclosure further provides a display device 40. As illustrated in FIG. 9, the display device 40 includes any one of the display substrate 20 or display panel 30 described above. The display device in this embodiment may be a display, an OLED panel, an OLED TV, an electronic paper, a mobile phone, a tablet computer, a laptop, a digital photo frame, a navigator, and other products or components with display functions.

At least one embodiment of the present disclosure further provides a method for manufacturing the above-mentioned display substrate 20. The structure and manufacturing method of the display substrate provided by at least one embodiment of the present disclosure are exemplarily described below with reference to FIG. 2A to FIG. 2C, FIG. 6B to FIG. 6D, and FIG. 7A to FIG. 7B. However, at least one embodiment of the present disclosure is not limited thereto.

In some examples, the manufacturing method includes the following steps S61 to S70.

Step S61: forming a semiconductor material layer on the base substrate, and performing a patterning process on the semiconductor material layer to form the semiconductor layer 102. The semiconductor layer 102 includes the active layers T1a to T7a and the doped region patterns (that is, the source region and drain region corresponding to each of the first to seventh transistors T1 to T7) of the first to seventh transistors T1 to T7 in each pixel region (as illustrated in FIG. 2B), and the active layer pattern and the doped region pattern of each transistor in one pixel region are provided through the same process. For example, the semiconductor layer 102 further includes the active layers and doped region patterns (that is, the source region and drain region corresponding to each of the eighth to tenth transistors T8 to T10) of the eighth to tenth transistors T8 to T10 in the non-display region NDA.

It should be noted that the active layer may include an integrally formed low-temperature polysilicon layer, in which the source region and the drain region may be conductive through doping or the like to realize electrical connection of each structure. That is, the active semiconductor layer of each transistor of each sub-pixel is an entire pattern formed of p-silicon, each transistor in one pixel region includes the doped region pattern (i.e., the source region and drain region) and the active layer pattern, and the active layers of different transistors are separated by doped structures.

Step S62: forming a first insulating layer 103 (for example, a transparent layer), such as a first gate insulating layer, on the semiconductor layer 102; and forming a plurality of first insulating layer via holes in the first insulating layer for connection with the pattern of the third conductive layer 203 formed subsequently. For example, corresponding to the positions of the source region and the drain region in the semiconductor layer, corresponding first insulating layer via holes are formed in the first insulating layer, that is, the first insulating layer via holes respectively overlap with the source region and the drain region in the semiconductor layer, so as to be used for the connection of the source region and the drain region with the data line 12, the first power line 250, or the like in the third conductive layer. For example, the first insulating layer via holes include the via hole 402, the via hole 405, the via hole 303, the via hole 305, etc.

Step S63: forming a first conductive material layer on the first insulating layer 103, and performing a patterning process on the first conductive material layer to form the first conductive layer 201. For example, the conductive layer 201 includes the scanning line 210, the reset control line 220, and the light-emitting control line 230, which are located in the display region DA and insulated from each other, and extend in the second direction. For example, for a row of pixel circuits, the correspondingly connected reset control line 220, scanning line 210, and light-emitting control line 230 are sequentially arranged in the first direction D1. For example, as illustrated in FIG. 6B, the first conductive layer 201 further includes the gate electrodes, wires, and the like of the eighth to tenth transistors T8 to T10 in the non-display region NDA.

For example, the first conductive layer 201 further includes the gate electrodes T1g to T7g of the first to seventh transistors T1 to T7. For example, the gate electrode T6g of the sixth transistor T6 and the reset control line 220 are provided as an integral structure, that is, a part of the reset control line 220 serves as the gate electrode T6g of the sixth transistor T6. The gate electrode T2g of the second transistor T2 and the scanning line 210 are provided as an integral structure, that is, a part of the scanning line 210 serves as the gate electrode T2g of the second transistor T2. The gate electrode T4g of the fourth transistor T4 and the gate electrode T5g of the fifth transistor T5 are provided as an integral structure with the light-emitting control line 230, that is, a part of the light-emitting control line 230 serves as the gate electrode T4g of the fourth transistor T4 and the gate electrode T5g of the fifth transistor T5. The gate electrode T7g of the seventh transistor T7 and the reset control line 220 corresponding to the next row of pixel circuits are provided as an integral structure. For example, the sixth transistor T6 and the third transistor T3 both have a double-gate structure, the two gate electrodes T6g of the sixth transistor T6 are both part of the reset control line 220, one gate electrode of the third transistor T3 is a part of the scanning line 210, and the other gate electrode of the third transistor T3 is provided as an integral part of the scanning line 210 and protrudes toward the sixth transistor T6.

For example, the portion, which is overlapped with the first conductive layer 201 in the direction perpendicular to the base substrate, of the semiconductor layer 102 is defined as the active layers (channel regions) T1a to T7a of the first to seventh transistors T1 to T7.

Step S64: as illustrated in FIG. 2B, by using a self-aligned process, performing conductive treatment (for example, doping treatment) on the semiconductor layer 102 using the first conductive layer 201 as a mask, so that the portion, which is not covered by the first conductive layer 201, of the semiconductor layer 102 is conductive, and thus the portions of the semiconductor layer 102 located on both sides of the active layer of each transistor are conductive, so as to form the source regions and drain regions of the first to tenth transistors T1 to T10, respectively, that is, the first electrodes (T1s to T10s) and the second electrodes (T1d to T10d) of the first to tenth transistors T1 to T10.

Step S65: forming a second insulating layer 104 (for example, a transparent layer) on the first conductive layer 201, for example as the second gate insulating layer; and forming at least the second insulating layer via hole corresponding to the first insulating layer via hole in the second insulating layer. For example, the via holes penetrating correspondingly at least the first insulating layer and the second insulating layer include the via hole 402, the via hole 405, the via hole 303, the via hole 305, or the like. The via hole in the first insulating layer and the via hole in the second insulating layer can also be formed in one process, which is not limited in the embodiments of the present disclosure.

Step S66: forming a second conductive material layer on the second insulating layer 104, and performing a patterning process on the second conductive material layer to form the second conductive layer 202 as illustrated in FIG. 2A, that is, forming the first electrode Ca of the storage capacitor which is insulated from each other and the reset voltage line 240 extending in the first direction.

For example, the first electrode Ca of the storage capacitor and the gate electrode T1g of the first transistor T1 at least partially overlap with each other in the direction perpendicular to the base substrate 101. The patterning process also forms the via hole 301 in the first electrode Ca of the storage capacitor, and the via hole 301 exposes at least part of the gate electrode T1g of the first transistor T1.

Step S67: forming the third insulating layer 105 on the second conductive layer 202. The third insulating layer may be, for example, an interlayer insulating layer. The via hole is formed in the third insulating layer for connection with the third conductive layer to be formed later. At least part of the via holes correspond to the positions of the first insulating layer via hole and the second insulating layer via hole, and pass through the first insulating layer, the second insulating layer, and the third insulating layer, such as the via hole 402, the via hole 405, the via hole 303, and the via hole 305.

Step S68: forming a third conductive material layer on the third insulating layer 105, and performing a patterning process on the third conductive material layer to form the third conductive layer 203. As illustrated in FIG. 2A, the third conductive layer 203 includes, for example, the data line 12, the first power line 250, the connection electrode 231, the connection electrode 232, and the connection electrode 233, which are insulated from each other. The data line 12 and the first power line 250 extend along the first direction D1. As illustrated in FIG. 6B to FIG. 6C, the third conductive layer 203 may also include the connection electrode 650 located in the non-display region NDA, a second electrode C1b of the storage capacitor of the first capacitor C1, and various signal lines (STV, CLK, CLKB, VGL, VGH).

For example, as illustrated in FIG. 2A, the data line 12 overlaps with the first electrode T2s of the second transistor T2 in the direction perpendicular to the base substrate 101 and is electrically connected to the first electrode T2s of the second transistor T2 through the via hole 305. For example, the via hole 305 penetrates the first insulating layer 103, the second insulating layer 104, and the third insulating layer 105.

For example, as illustrated in FIG. 2A, the first power line 250 is electrically connected to the first electrode Ca of the storage capacitor of the sub-pixel in the corresponding column through the via hole 302, and is electrically connected to the first electrode T4s of the fourth transistor T4 through the via hole 303. For example, the via hole 302 penetrates the third insulating layer 105, and the via hole 303 penetrates the first insulating layer 103, the second insulating layer 104, and the third insulating layer 105.

For example, as illustrated in FIG. 2A, one end of the connection electrode 231 is electrically connected to the gate electrode T1g of the first transistor T1, that is, the second electrode Cb of the storage capacitor through the via hole 301 in the first electrode Ca of the storage capacitor and the via hole 401 in the insulating layer, and the other end of the connection electrode 231 is electrically connected to the first electrode of the third transistor T3 through the via hole 402, thereby electrically connecting the second electrode Cb of the storage capacitor to the first electrode T3s of the third transistor T3. For example, the via hole 401 penetrates the second insulating layer 104 and the third insulating layer 105, and the via hole 402 penetrates the first insulating layer 103, the second insulating layer 104, and the third insulating layer 105.

For example, as illustrated in FIG. 2A, one end of the connection electrode 232 is electrically connected to the reset voltage line 240 through the via hole 403, and the other end of the connection electrode is electrically connected to the sixth transistor T6 through the via hole 404, so that the first electrode T6s of the sixth transistor T6 may receive the first reset voltage Vinit1 from the reset voltage line 240. For example, the via hole 403 penetrates the third insulating layer 105, and the via hole 404 penetrates the first insulating layer 103, the second insulating layer 104, and the third insulating layer 105.

For example, as illustrated in FIG. 2A, the connection electrode 233 is electrically connected to the second electrode T5d of the fifth transistor T5 through the via hole 405, and is used to connect the second electrode T5d of the fifth transistor T5 to the first electrode 134 of the light-emitting element. For example, the via hole 405 penetrates the first insulating layer 103, the second insulating layer 104, and the third insulating layer 105.

Step S69: forming the fourth insulating layer 106 on the third conductive layer 203, and forming the via hole in the third insulating layer for connection with the fourth conductive layer to be formed later. In some embodiments, for example, the fourth insulating layer 106 includes the first planarization layer. In other embodiments, for example, the fourth insulating layer 106 includes two layers of the passivation layer and the first planarization layer, and the via hole formed in the fourth insulating layer needs to penetrate through the two layers of the passivation layer and the first planarization layer. For example, the first planarization layer is located on a side of the passivation layer away from the third conductive layer. For example, the first planarization layer is an organic insulating material, and the passivation layer is an inorganic insulating material.

Step S70: forming a fourth conductive material layer on the fourth insulating layer 106, and performing a patterning process on the fourth conductive material layer to form the fourth conductive layer 204. The fourth conductive layer 204 includes the first portion 204a located in the display region DA and the second portion 204b located in the non-display region NDA. As illustrated in FIG. 2A, the first portion 204a includes the connection electrode 234. As illustrated in FIG. 6B, the second portion 204b includes auxiliary signal lines corresponding to respective signal lines, bonding electrodes 80, wires 81, and the like. The first portion 204a and the first power line 250 do not overlap in the direction perpendicular to the base substrate 101.

For example, as illustrated in FIG. 2A, the connection electrode 234 overlaps with the connection electrode 233 in the direction perpendicular to the base substrate 101, and the connection electrode 234 is electrically connected to the connection electrode 233 through the via hole 307 penetrating the fourth insulating layer 106.

For example, the manufacturing method of the display substrate may further include forming the fifth insulating layer 107 on the fourth conductive layer 204, and forming the via hole in the fifth insulating layer 107 for connection with the fifth conductive layer formed subsequently. For example, the fifth insulating layer 107 may be a second planarization layer. Referring to FIG. 2C, the fifth insulating layer via hole is used to connect the first electrode 134 of the light-emitting element 120 to the connection electrode 234. The fifth insulating layer via hole may overlap with or may not overlap with the second electrode of the fifth transistor T5.

For example, the manufacturing method of the display substrate may further include forming a fifth conductive material layer on the fifth insulating layer 107, and performing a patterning process on the fifth conductive material layer to form the fifth conductive layer 205, that is, forming a plurality of first electrodes 134 which are insulated from each other and are used for forming light-emitting elements.

For example, as illustrated in FIG. 2C, the manufacturing method of the display substrate may further include sequentially forming the pixel definition layer 108 on the fifth conductive layer 205, forming the opening region 600 corresponding to the main body 141 of each first electrode 134 in the pixel definition layer 108, forming the light-emitting layer 136 at least in the opening region 600, and forming the second electrode 135 on the light-emitting layer.

For example, the material of the semiconductor material layer includes, but is not limited to, silicon-based materials (a-Si, polysilicon p-Si, etc.), metal oxide semiconductors (IGZO, ZnO, AZO, IZTO, etc.), and organic materials (hexathiophene, polythiophene, etc.).

For example, the materials of the first conductive material layer, the second conductive material layer, the third conductive material layer, the fourth conductive material layer, the fifth conductive material layer, and the second electrode may include gold (Au), silver (Ag), Copper (Cu), aluminum (Al), molybdenum (Mo), magnesium (Mg), tungsten (W), and alloy materials combined with the above metals, or may also include transparent metal oxide conductive materials, such as indium tin oxide (ITO), indium zinc oxide (IZO), zinc oxide (ZnO), zinc aluminum oxide (AZO), etc.

For example, the first insulating layer 103, the second insulating layer 104, the third insulating layer 105, the fourth insulating layer 106, and the fifth insulating layer 107 are, for example, inorganic insulating layers, for example, including silicon oxides, such as silicon oxide, silicon nitride, and silicon oxynitride, silicon nitrides or oxide nitrides, aluminum oxide, titanium nitride, or other metal oxynitride insulating materials. For example, some of these insulating layers may also be organic materials, such as the first planarization layer and the second planarization layer, such as polyimide (PI), acrylate, epoxy, polymethylmethacrylate (PMMA), etc. The embodiments of the present disclosure do not limit this. For example, each of the fourth insulating layer 106 and the fifth insulating layer 107 may include the planarization layer.

For example, the above-mentioned patterning process may adopt the conventional photolithography process, for example, including steps of photoresist coating, exposure, development, drying, etching, etc.

What have been described above merely are specific implementations of the present disclosure, and the protection scope of the present disclosure is not limited thereto. The protection scope of the present disclosure should be based on the protection scope of the claims.

What is claimed is:

1. A display substrate, comprising:
   a base substrate, comprising a display region and a non-display region;
   a plurality of sub-pixels in the display region of the base substrate,
   wherein each of the plurality of sub-pixels comprises a pixel circuit, the pixel circuit is configured to drive a light-emitting element to emit light, and pixels circuits of the plurality of sub-pixels are arranged in a plurality of rows and a plurality of columns along a first direction and a second direction;
   the pixel circuit comprises a driving sub-circuit, a data writing sub-circuit, a compensation sub-circuit, and a storage sub-circuit;
   the driving sub-circuit comprises a control terminal, a first terminal, and a second terminal, and is configured to be connected to the light-emitting element and control a driving current flowing through the light-emitting element;
   the data writing sub-circuit comprises a control terminal, a first terminal, and a second terminal, the control terminal of the data writing sub-circuit is configured to receive a first scanning signal, the first terminal of the data writing sub-circuit is configured to receive a data signal, the second terminal of the data writing sub-circuit is electrically connected to the driving sub-circuit, and the data writing sub-circuit is configured to write the data signal into the first terminal of the driving sub-circuit in response to the first scanning signal;

the compensation sub-circuit comprises a control terminal, a first terminal, and a second terminal, the control terminal of the compensation sub-circuit is configured to receive a second scanning signal, the first terminal and the second terminal of the compensation sub-circuit are electrically connected to the control terminal and the second terminal of the driving sub-circuit, respectively, and the compensation sub-circuit is configured to perform threshold compensation on the driving sub-circuit in response to the second scanning signal; and the storage sub-circuit is electrically connected to the control terminal of the driving sub-circuit and a first voltage terminal and is configured to store the data signal, the storage sub-circuit comprises a storage capacitor, the storage capacitor comprises a first electrode and a second electrode, the first electrode of the storage capacitor is electrically connected to the first voltage terminal, and the second electrode of the storage capacitor is electrically connected to the control terminal of the driving sub-circuit;

a first power line, wherein the first power line is in the display region and extended along the first direction, and the first power line is connected to the first voltage terminal, and is configured to provide a first power voltage for the plurality of sub-pixels; and an electrical connection layer, on a side of the pixel circuit away from the base substrate, wherein the electrical connection layer comprises a first portion in the display region, the first portion comprises a plurality of first connection electrodes, and the plurality of first connection electrodes are arranged in one-to-one correspondence with the plurality of sub-pixels, respectively;

wherein the pixel circuit of each sub-pixel is electrically connected to a corresponding first connection electrode through a first via hole, and the first connection electrode corresponding to the each sub-pixel is configured to be electrically connected to the light-emitting element through a second via hole, so as to electrically connect the pixel circuit of the each sub-pixel to the light-emitting element;

the first via hole and the second via hole are not overlapped in a direction perpendicular to the base substrate; and the first portion of the electrical connection layer and the first power line are not overlapped in the direction perpendicular to the base substrate;

the display substrate further comprises a power signal line and a gate driving circuit in the non-display region, and the gate driving circuit is configured to provide the first scanning signal and the second scanning signal for the sub-pixels, and the power signal line is configured to provide a power signal for the gate driving circuit of the sub-pixels;

the electrical connection layer further comprises a second portion in the non-display region, the second portion comprises an auxiliary signal line, and the auxiliary signal line is connected in parallel with the power signal line;

the gate driving circuit comprises a plurality of shift register units, the plurality of shift register units are connected to the plurality of rows of sub-pixels in one-to-one correspondence, and each of the plurality of shift register units is configured to output the first scanning signal and the second scanning signal to a corresponding row of sub-pixels through an output node;

each of the plurality of shift register units comprises a first capacitor connected to the output node, and the first capacitor comprises a first electrode and a second electrode; and the second portion of the electrical connection layer further comprises an auxiliary capacitor electrode, and the auxiliary capacitor electrode is connected in parallel with the first electrode or the second electrode of the first capacitor.

2. A display substrate, comprising:

a base substrate, comprising a display region and a non-display region;

a plurality of sub-pixels in the display region of the base substrate, wherein each of the plurality of sub-pixels comprises a pixel circuit, the pixel circuit is configured to drive a light-emitting element to emit light, and pixels circuits of the plurality of sub-pixels are arranged in a plurality of rows and a plurality of columns along a first direction and a second direction;

the pixel circuit comprises a driving sub-circuit, a data writing sub-circuit, a compensation sub-circuit, and a storage sub-circuit;

the driving sub-circuit comprises a control terminal, a first terminal, and a second terminal, and is configured to be connected to the light-emitting element and control a driving current flowing through the light-emitting element;

the data writing sub-circuit comprises a control terminal, a first terminal, and a second terminal, the control terminal of the data writing sub-circuit is configured to receive a first scanning signal, the first terminal of the data writing sub-circuit is configured to receive a data signal, the second terminal of the data writing sub-circuit is electrically connected to the driving sub-circuit, and the data writing sub-circuit is configured to write the data signal into the first terminal of the driving sub-circuit in response to the first scanning signal;

the compensation sub-circuit comprises a control terminal, a first terminal, and a second terminal, the control terminal of the compensation sub-circuit is configured to receive a second scanning signal, the first terminal and the second terminal of the compensation sub-circuit are electrically connected to the control terminal and the second terminal of the driving sub-circuit, respectively, and the compensation sub-circuit is configured to perform threshold compensation on the driving sub-circuit in response to the second scanning signal; and the storage sub-circuit is electrically connected to the control terminal of the driving sub-circuit and a first voltage terminal and is configured to store the data signal, the storage sub-circuit comprises a storage capacitor, the storage capacitor comprises a first electrode and a second electrode, the first electrode of the storage capacitor is electrically connected to the first voltage terminal, and the second electrode of the storage capacitor is electrically connected to the control terminal of the driving sub-circuit;

a first power line, wherein the first power line is in the display region and extended along the first direction, and the first power line is connected to the first voltage terminal, and is configured to provide a first power voltage for the plurality of sub-pixels; and an electrical connection layer, on a side of the pixel circuit away from the base substrate, wherein the electrical connection layer comprises a first portion in the display region, the first portion comprises a plurality of first connection electrodes, and the plurality of first connection electrodes are arranged in one-to-one correspondence with the plurality of sub-pixels, respectively:

the pixel circuit of each sub-pixel is electrically connected to a corresponding first connection electrode through a first via hole, and the first connection electrode corresponding to the each sub-pixel is configured to be electrically connected to the light-emitting element through a second via hole, so as to electrically connect the pixel circuit of the each sub-pixel to the light-emitting element;

the first via hole and the second via hole are not overlapped in a direction perpendicular to the base substrate; and the first portion of the electrical connection layer and the first power line are not overlapped in the direction perpendicular to the base substrate;

the sub-pixel further comprises a first light-emitting control sub-circuit, the first light-emitting control sub-circuit comprises a control terminal, a first terminal, and a second terminal, the first terminal of the first light-emitting control sub-circuit is electrically connected to the driving sub-circuit, the second terminal of the first light-emitting control sub-circuit is configured to be electrically connected to the first connection electrode through a third via hole, and the control terminal of the first light-emitting control sub-circuit is configured to receive a first light-emitting control signal;

the first light-emitting control sub-circuit is configured to allow the driving current to be applied to the light-emitting element in response to the first light-emitting control signal; and the first via hole, the second via hole, and the third via hole are not overlapped with each other in the direction perpendicular to the base substrate;

the display substrate further comprises a first light-emitting control line, the first light-emitting control line is extended along the second direction and is connected to the control terminal of the first light-emitting control sub-circuit to provide the first light-emitting control signal, and an orthographic projection of the first via hole on the base substrate and an orthographic projection of the second via hole on the base substrate are on both sides of an orthographic projection of the first light-emitting control line on the base substrate, respectively.

3. The display substrate according to claim 2, wherein the first via hole and the second via hole are arranged along the first direction.

4. The display substrate according to claim 2, further comprising a power signal line and a gate driving circuit in the non-display region, wherein the gate driving circuit is configured to provide the first scanning signal and the second scanning signal for the sub-pixels, and the power signal line is configured to provide a power signal for the gate driving circuit of the sub-pixels; and the electrical connection layer further comprises a second portion in the non-display region, the second portion comprises an auxiliary signal line, and the auxiliary signal line is connected in parallel with the power signal line.

5. The display substrate according to claim 2, wherein for at least one of the plurality of the sub-pixels, a portion, exposed by the second via hole, of the first connection electrode has an inclined surface with respect to the base substrate.

6. The display substrate according to claim 2, wherein each sub-pixel further comprises a second connection electrode, the second connection electrode is on a side of the first electrode of the storage capacitor away from the base substrate, and the second connection electrode is respectively connected to the second electrode of the storage capacitor and the second terminal of the compensation sub-circuit.

7. The display substrate according to claim 6, wherein the second connection electrode is overlapped with the first connection electrode in the direction perpendicular to the base substrate.

8. The display substrate according to claim 6, wherein the driving sub-circuit comprises a first transistor, and a gate electrode, a first electrode, and a second electrode of the first transistor serve as the control terminal, the first terminal, and the second terminal of the driving sub-circuit, respectively.

9. The display substrate according to claim 8, wherein the first electrode of the storage capacitor comprises a fourth via hole, and the second connection electrode is electrically connected to the second electrode of the storage capacitor through the fourth via hole.

10. The display substrate according to claim 9, wherein the fourth via hole and an active layer of the first transistor are not overlapped with each other in the direction perpendicular to the base substrate.

11. The display substrate according to claim 8, wherein an active layer of the first transistor is similar to a Ω shape, and comprises a first portion, a second portion, and a connection portion, the first portion and the second portion of the active layer are both linear and not on one identical horizontal line, and the connection portion of the active layer connects the first portion and the second portion of the active layer and is arc-shaped.

12. The display substrate according to claim 11, wherein an average width of the connection portion of the active layer is greater than an average width of the first portion or the second portion of the active layer.

13. The display substrate according to claim 8, further comprising a data line, wherein the data line is extended along the first direction and is connected to the first terminal of the data writing sub-circuit to provide the data signal, the first electrode of the storage capacitor overlaps with the first electrode of the first transistor in the direction perpendicular to the base substrate, the first electrode of the first transistor has a first electrode side which is close to the data line and along the first direction, the first electrode of the storage capacitor has a capacitor electrode side which is close to the data line and along the first direction, and in the second direction, the capacitor electrode side is closer to the data line than the first electrode side.

14. The display substrate according to claim 2, wherein the non-display region comprises a bonding region, the electrical connection layer further comprises a second portion in the non-display region, and the second portion of the electrical connection layer comprises a bonding electrode in the non-display region; and the display substrate further comprises an auxiliary bonding electrode, the auxiliary bonding electrode is in a same layer and of a same material as the first power line, and the auxiliary bonding electrode contacts with the bonding electrode for connection.

15. The display substrate according to claim 14, wherein the second portion of the electrical connection layer further comprises a wire in the non-display region, one end of the wire is connected to the bonding electrode, and another end of the wire is extended to the display region; and the non-display region further comprises a bending region, and a part of the wire is in the bending region.

16. The display substrate according to claim 2, wherein no pattern of the electrical connection layer in the display region is overlapped with the first power line in the direction perpendicular to the base substrate.

17. A display device, comprising the display substrate according to claim 2.

18. A display substrate, comprising:
- a base substrate, comprising a display region and a non-display region;
- a plurality of sub-pixels in the display region of the base substrate, wherein each of the plurality of sub-pixels comprises a pixel circuit, the pixel circuit is configured to drive a light-emitting element to emit light, and pixels circuits of the plurality of sub-pixels are arranged in a plurality of rows and a plurality of columns along a first direction and a second direction;
- the pixel circuit comprises a driving sub-circuit, a data writing sub-circuit, a compensation sub-circuit, and a storage sub-circuit;
- the driving sub-circuit comprises a control terminal, a first terminal, and a second terminal, and is configured to be connected to the light-emitting element and control a driving current flowing through the light-emitting element;
- the data writing sub-circuit comprises a control terminal, a first terminal, and a second terminal, the control terminal of the data writing sub-circuit is configured to receive a first scanning signal, the first terminal of the data writing sub-circuit is configured to receive a data signal, the second terminal of the data writing sub-circuit is electrically connected to the driving sub-circuit, and the data writing sub-circuit is configured to write the data signal into the first terminal of the driving sub-circuit in response to the first scanning signal;
- the compensation sub-circuit comprises a control terminal, a first terminal, and a second terminal, the control terminal of the compensation sub-circuit is configured to receive a second scanning signal, the first terminal and the second terminal of the compensation sub-circuit are electrically connected to the control terminal and the second terminal of the driving sub-circuit, respectively, and the compensation sub-circuit is configured to perform threshold compensation on the driving sub-circuit in response to the second scanning signal; and
- the storage sub-circuit is electrically connected to the control terminal of the driving sub-circuit and a first voltage terminal and is configured to store the data signal, the storage sub-circuit comprises a storage capacitor, the storage capacitor comprises a first electrode and a second electrode, the first electrode of the storage capacitor is electrically connected to the first voltage terminal, and the second electrode of the storage capacitor is electrically connected to the control terminal of the driving sub-circuit;
- a first power line, wherein the first power line is in the display region and extended along the first direction, and the first power line is connected to the first voltage terminal, and is configured to provide a first power voltage for the plurality of sub-pixels; and
- an electrical connection layer, on a side of the pixel circuit away from the base substrate, wherein the electrical connection layer comprises a first portion in the display region, the first portion comprises a plurality of first connection electrodes, and the plurality of first connection electrodes are arranged in one-to-one correspondence with the plurality of sub-pixels, respectively:
- the pixel circuit of each sub-pixel is electrically connected to a corresponding first connection electrode through a first via hole, and the first connection electrode corresponding to the each sub-pixel is configured to be electrically connected to the light-emitting element through a second via hole, so as to electrically connect the pixel circuit of the each sub-pixel to the light-emitting element;
- the first via hole and the second via hole are not overlapped in a direction perpendicular to the base substrate; and
- the first portion of the electrical connection layer and the first power line are not overlapped in the direction perpendicular to the base substrate;
- the non-display region comprises a bonding region, the electrical connection layer further comprises a second portion in the non-display region, and the second portion of the electrical connection layer comprises a bonding electrode in the non-display region; and
- the display substrate further comprises an auxiliary bonding electrode, the auxiliary bonding electrode is in a same layer and of a same material as the first power line, and the auxiliary bonding electrode contacts with the bonding electrode for connection;
- the second portion of the electrical connection layer further comprises a wire in the non-display region, one end of the wire is connected to the bonding electrode, and another end of the wire is extended to the display region; and the non-display region further comprises a bending region, and a part of the wire is in the bending region;
- the display substrate further comprises an organic insulating layer,
- wherein the organic insulating layer is between the electrical connection layer and the pixel circuit, and the first via hole is in the organic insulating layer; and
- the organic insulating layer comprises a bending portion in the bending region, and the bending portion is on a side of the wire close to the base substrate and is in direct contact with the base substrate.

* * * * *